(12) United States Patent
Yamauchi et al.

(10) Patent No.: US 6,492,689 B2
(45) Date of Patent: Dec. 10, 2002

(54) SEMICONDUCTOR DEVICE SWITCHING REGULATOR USED AS A DC REGULATED POWER SUPPLY

(75) Inventors: Shunichi Yamauchi, Tsurugashima (JP); Yoshito Nakazawa, Takasaki (JP); Yuji Yatsuda, Kumagaya (JP)

(73) Assignees: Hitachi, Ltd., Tokyo (JP); Hitachi Tohbu Semiconductor, Ltd., Gunma (JP)

( * ) Notice: Subject to any disclaimer, the term of this patent is extended or adjusted under 35 U.S.C. 154(b) by 0 days.

(21) Appl. No.: 09/842,015

(22) Filed: Apr. 26, 2001

(65) Prior Publication Data

US 2001/0035554 A1 Nov. 1, 2001

(30) Foreign Application Priority Data

Apr. 28, 2000 (JP) ........................................ 2000-130705

(51) Int. Cl.[7] ............................................... H01L 27/04
(52) U.S. Cl. ..................... 257/379; 257/359; 257/363; 257/489; 257/490
(58) Field of Search ................................ 257/358, 359, 257/362, 363, 379, 488–490

(56) References Cited

U.S. PATENT DOCUMENTS 4,707,719 A * 11/1987 Whight ........................ 257/489
5,315,139 A *  5/1994 Endo ........................... 257/489
5,324,971 A *  6/1994 Notley ......................... 257/490
5,903,033 A *  5/1999 Suwa ........................... 257/358

FOREIGN PATENT DOCUMENTS

JP          9-186315         7/1997

OTHER PUBLICATIONS

IEEE Transactions on Electron Devices, vol. 44, No. 11, Nov. 1997, "Spiral Junction Termination", D. Krizaj et al, pp. 2002–2010.

* cited by examiner

Primary Examiner—Gene M. Munson
(74) Attorney, Agent, or Firm—Mattingly, Stanger & Malur, P.C.

(57) ABSTRACT

In a driving power IC including a starter circuit comprising a main-switch (MS) transistor, a starter switch (SS) for starting the MS transistor and a start resistor (or a resistor element) SR, the start resistor is created on a field insulation film. In a periphery area of a chip for integrating the driving power IC, that is, on a semiconductor substrate's surface beneath the field insulation film, field limiting rings (FLRS) are created, enclosing an active area in a multiplexed state. The resistor element is extended from a start edge on the inner side of a group of said field limiting rings to an end edge on the outer side of the group, having a zigzag shape. The electric potentials appearing at portions of the start resistor along a straight line connecting the start edge to the end edge and the electric potentials appearing at portions on the surface of the semiconductor substrate which correspond to the portions on the start resistor agree with each other, or the latter potentials are approximately close to the former potentials.

18 Claims, 14 Drawing Sheets

SEMICONDUCTOR DEVICE SWITCHING REGULATOR USED AS A DC REGULATED POWER SUPPLY

BACKGROUND OF THE INVENTION

In general, the present invention relates to a semiconductor device and a method of manufacturing the semiconductor device. More particularly, the present invention relates to an effective technique applied to a technology of putting a switching regulator used as a direct-current regulated power supply in an IC (Integrated Circuit).

A direct-current regulated power supply is used for driving electronic devices such as a personal computer and a hand phone or electronic circuits with a high degree of precision and in accordance with specifications. A switching direct-current regulated power supply also referred to as a switching regulator is known as one of direct-current regulated power supplies. A switching regulator once rectifies an alternating-current input voltage into a direct-current voltage and then converts the direct-current voltage back into an alternating-current voltage by using an on/off circuit comprising transistors before again rectifying the alternating-current voltage into a final direct-current output by using a rectification circuit. Control methods adopted by a switching regulator include a pulse-width control technique of controlling the width of pulses generated within a fixed period of time and a frequency control technique of varying the number of generated pulses in accordance with the magnitude of a load.

In the IEEE Transactions on Electron Devices, Vol. 44, No. 11, November 1997, pp 2002 to 2010, there is described a technology of putting a portion of a switching regulator in an integrated circuit. This reference discloses an SJT (Spiral Junction Termination) structure wherein, during a process of putting the switching regulator in an integrated circuit, a resistor element is formed into a spiral shape, and its center portion is connected to a high electric potential while its circumferential portion is connected to the ground electric potential. The resistor element having such a spiral shape is created in an active area.

In Japanese Patent Laid-open No. Hei 9(1997)-186315, on the other hand, there is disclosed an insulated gate bipolar transistor (IGBT) for use in an inverter for reducing a drop in strength to withstand a voltage. This reference discloses typical creation of an over-voltage-suppressing diode by providing an FLR (Field Limiting Ring) on the surface portion of a semiconductor substrate (drift layer) on the circumference (periphery area) of a semiconductor chip and creating the diode on the drift layer with an oxide film sandwiched between the drift layer and the diode. In this example, distribution of electric potentials is optimized to suppress a drop in strength to withstand a voltage by making the device dimensions of the FLR equal to 4/5 times the device dimensions of the over-voltage-suppressing diode.

SUMMARY OF THE INVENTION

Nowadays, the alternating-current voltage of the commercial power supply varies from country to country. For example, the alternating-current voltage in Japan is 100 V or 200 V while the voltage is 115 V in the US and 220 V to 240 V in Europe.

A switching regulator has a main switch and a starter circuit for activating the main switch. The starter circuit comprises a starter switch and a start resistor (a resistor element).

In a switching regulator connected to a direct-current power supply operating by rectification of a 240V alternating-current input, a transistor requires a maximum withstand voltage of about 700 V. In order to deliver the switching regulator as a product assuring this maximum withstand voltage, it is necessary to set a design value of the main switch and the starter switch at about 750 V.

A breakdown of any of transistors comprising the main and starter switches is caused by a high voltage applied to the transistor. It is desirable to devise such main and starter switches that an inevitable breakdown occurs on a portion other than the surface of a device with a large area. Concretely, it is desirable to avoid a breakdown of a start resistor element which has a small area and is prone to a breakdown occurring on the surface. However, it is inevitable to have a breakdown occur in a MOSFET (Metal Oxide Semiconductor Field Effect Transistor) and a power MISFET (Metal Insulator Semiconductor Field Effect Transistor), which have a large area and are difficult to fall into a state of breakdown occurring on the surface. Thus, if the withstand voltage of a power MISFET is set in the range 750 V to 800 V, it will be desirable to set the withstand voltage of a start resistor at a value of at least 800 V.

Since there is no case in which a start resistor with such a withstand voltage of at least 800 V is included in an integrated circuit, however, it is necessary to launch new developments.

The inventor of the present invention studied the creation of a resistor into a spiral shape as is disclosed in the reference cited above. In an experiment conducted as part of the study, the inventor discovered a phenomenon in which, as the voltage applied to the resistor element increases, its resistance decreases, allowing a large current to flow. Further, since the resistor element is formed in an active region of a semiconductor substrate in which IC is formed, the IC chip increases in size and manufacturing cost increases. In dependence on the layout of the resistor element, a parasitic interaction with another device adjacent to the resistor element may probably occur.

In order to solve the problems described above, the inventor of the present invention has proposed a configuration wherein a resistor element having a zigzag shape is provided on a field insulation layer created on a periphery area of a semiconductor chip in a direction from the center of the semiconductor chip to the circumference thereof and has proposed a technology of preventing the field insulation layer from breaking down due to application of a high voltage. The zigzag portion is extended to cross each ring portions of a plurality of FLRs enclosing an active area of the semiconductor chip in a multiplexed state.

In such a resistor element having a zigzag shape, however, the following problems have been identified. FIGS. 26(a) to 26(c) are diagrams showing results of an analysis of an already proposed technology. To be more specific, FIG. 26(a) shows a model of a zigzag pattern of a resistor layer used as a start resistor SR. FIG. 26(b) shows a cross section of a portion including a resistor layer and FLRs of a driving power IC. FIG. 26(c) shows graphs representing the electric potential of a resistor layer and the electric potential of a semiconductor substrate surface including an FLR. It should be noted that, while 5 FLRs P1 to P5 are described in this analytical study, the number of FLRs is not limited to 5.

In other words, FIG. 26(b) is a diagram showing a cross section of a periphery portion of a semiconductor chip in which a driving power IC is created. The figure shows a semiconductor substrate 1 made of $n^+$ silicon with an $n^-$ epitaxial layer 2 created on the main surface thereof.

In the semiconductor chip, a periphery area is located on the periphery of the semiconductor substrate's active area in which devices such as transistors are created. On the main surface of the epitaxial layer 2 of this periphery area, a field insulation film 3 made of LOCOS (Local Oxidation of Silicon) is created. On the main surface of the semiconductor substrate of the periphery area, that is, on the main surface of the epitaxial layer 2, five field limiting rings (FLRs) 13 are created, enclosing the active area not shown in the figure. Made of a p diffusion layer, the five FLRs 13 are distinguished from each other by assigning reference notations P1 to P5 thereto respectively. It should be noted that a p diffusion layer P0 held at the electric potential GND of the ground is created on the inner side of the FLR P1.

In addition, on the edge of the semiconductor chip, a guard ring 14 is provided. To be more specific, the guard ring 14 is created on the surface of the epitaxial layer 2 under an insulation film 24, which is thinner than the field insulation film 3 and provided at a location separated away from the field insulation film 3. The guard ring 14 is created in a $n^+$ diffusion area having a ring shape. The $n^+$ diffusion area is formed by diffusing impurities into the main surface of the epitaxial layer 2 at a high concentration.

A resistor layer 20 made of a poly-silicon layer is formed on the field insulation film 3. The surface of the resistor layer 20 is covered by an interlayer insulation film 9. A contact hole 21 is formed by boring a location on the interlayer insulation film 9 above the p diffusion layer P0 and a contact hole 22 is formed by boring a periphery location on the interlayer insulation film 9. A contact hole 23 is formed at a location outside the edge of the field insulation film 3. The contact hole 23 is extended to a location outside the insulation film 24, which is thinner than the field insulation film 3 and provided at a location separated away from the field insulation film 3 as described above.

Conductor films 25 to 28 each having a ring shape are created along the periphery of the semiconductor chip on the interlayer insulation film 9. The conductor film 25 is created on the inner side of the periphery area, that is, on the active-area side of the periphery area. The conductor film 25 also fills up the contact hole 21, being electrically connected to the resistor layer 20. The conductor film 26 is created at a location adjacent to the conductor film 25 on the outer side of the conductor film 25 and is electrically connected to the p diffusion layer P0 held at the ground electric potential GND used as a reference electric potential. The conductor film 27 is created above the FLR 13 (P5) on the outermost circumference, being electrically connected to the FLR 13. The conductor film 28 also fills up the contact holes 22 and 23 and is electrically connected to the resistor layer 20 and the guard ring 14.

As an applied voltage is increased in the group of FLRs 13 described above, a depletion layer extends from an FLR 13 on an inner circumference to an FLR 13 on an outer circumference before an avalanche breakdown occurs, resulting in a punch-through structure and, eventually, a breakdown occurs at a pn junction of the FLR 13 on the outermost circumference. By providing a group of FLRs 13 as described above, the strength to withstand a voltage can be increased to a product of a punch-through voltage and the number of FLRs 13. Thus, the withstand voltage of the start resistance SR is equal to the sum of the withstand voltage of the portion comprising the FLRs 13 and a withstand voltage due to, among other factors, the thickness of the field insulation film 3. As a result, the start resistance SR has a total withstand voltage of at least 800 V.

A resistor-layer portion corresponding to the contact hole 21 is the start edge 31 of the resistor element serving as the start resistor SR and a resistor-layer portion corresponding to the contact hole 22 is the end edge 32 of the start resistor SR. A pattern of the resistor layer 20 serving as the resistance SR starting from the start edge 31 to ending at the end edge 32 displays a zigzag shape which has a fixed amplitude and changes the direction at fixed pitch intervals as shown in FIG. 26(a). In FIG. 26(b), however, the zigzag shape is not explicitly shown for the sake of simplicity.

By forming the resistor layer 20 into a zigzag pattern as described above, the length of the resistor layer 20 increases, resulting in a greater heat-dissipating area and a reduced electrical-field intensity. As a result, it is possible to avoid destruction caused by heat dissipated by the resistor element and destruction caused by an excessively strong electric field.

In addition, by forming the resistor layer 20 into a zigzag pattern, it is possible to provide a configuration wherein the resistance per unit length of the resistor layer 20 is increased over the resistance per unit length of a resistor having a shape like a straight line connecting the start edge 31 to the end edge 32.

When a high electric potential is applied to the start resistor SR, electric fields are generated in the start resistor SR and the FLRs 13. By providing the start resistor SR on the field insulation film 3 including an area for placing the FLRs 13 as described above, however, a difference between the electric field generated in the start resistor SR and the electric field generated in the FLRs 13 is reduced. Thus, the field insulation film 3 is relieved from an electric field applied thereto. As a result, destruction of the field insulation film 3 can be avoided.

In accordance with an analysis performed by the inventor and others, the electric potential of the start resistor SR does not exhibit the same variations as the electric potential of the semiconductor-substrate surface including the FLRs 13 as shown in FIG. 26(c). It has also been discovered that the difference between the potentials reaches a maximum value at the FLR 13 on the outermost circumference. This is because, even though the resistor layer 20 having a uniform thickness is formed into a uniform-width zigzag shape varying the direction at fixed pitch intervals from the start edge 31 to the end edge 32, the electric potential varies like a straight line as if the resistor layer 20 were replaced by a straight-line resistor connecting the start edge 31 to the end edge 32 as shown in FIG. 26(c). On the other hand, it has also been discovered that the potential on the surface of the semiconductor substrate, that is, the potential on the boundary surface between the field insulation film 3 and the semiconductor substrate 1 on the portions of the FLRs 13, changes like a staircase as shown in FIG. 26(c) and, in an area on the outer-circumference side of the FLR 13 on the outermost circumference, the potential changes like a curve.

In the portion of the FLR 13 on the outermost circumference, a strong electric field is generated. Electrons of electron-hole pairs generated in bulk are strongly attracted by a poly-silicon layer serving as the resistor layer 20 and many of the attracted electrons are trapped in the field insulation film 3. The electric charge inverts the surface of the $n^-$ epitaxial layer 2 between the FLRs 13 on the surface of the semiconductor substrate into a p type, causing a channel leak reducing the strength to withstand a voltage.

The inventor and others conducted a measurement experiment on a driving power IC. FIG. 28 is a diagram showing a measurement circuit of a driving power IC (power MOS chip) The driving power IC has a structure wherein a main switch MS, a starter switch SS and a start resistor SR are embedded monolithically on a silicon semiconductor substrate even though the driving power IC is not specially limited to such a structure. The main switch MS includes a main MOS (MAIN-MOS) comprising 2,270 cells and a current-sensing MOS (CS-MOS) comprising 2 cells for sensing a current. Four electrodes of the main switch MS are connected to a drain terminal DRAIN, a source terminal SOURCE, a gate terminal GATE and a current-sensing terminal CS respectively.

The starter switch SS is a start MOS (START-MOS) comprising 60 cells even though the starter switch SS is not specially limited to such a MOS. 3 electrodes of the starter switch SS are connected to the drain terminal cited above, a start-MOS gate terminal and a start-MOS source gate terminal respectively. The start-MOS gate terminal of the starter switch SS is connected to the common drain terminal by a series start resistor SR of typically 2 MΩ.

With a voltage Vds applied between the common drain terminal of the driving power IC and the other terminals of the main switch MS and the starter switch SS, results of measuring a current Ids flowing from the other terminals of the main switch MS and the drain terminal are represented by a graph shown in FIG. 27.

FIG. 27 is a diagram showing a comparison of a graph representing data obtained at an initial time (at 0 hours) with a graph representing data obtained after an experiment, that is, after a time lapse of 48 hours, with the experiment conducted on a driving power IC in an environment at an ambient temperature of 150° C. and a Vds value of 750 V. The graphs represent relations between the voltage (Vds) and the current (Ids) with the horizontal and vertical axes indicating values of the former and the latter respectively.

A discovery is obvious from the curves. That is, the curve representing data obtained at an initial time reveals occurrence of an avalanche breakdown at an applied voltage of about 800 V. On the other hand, the curve representing data obtained after the experiment reveals a phenomenon that, as the applied voltage exceeds a level of about 600 V, a channel-leak current flows, resulting in an increase in current and, at an applied voltage of about 800 V, an avalanche breakdown occurs.

Then, prior to a study of a structure for avoiding such an undesirable phenomenon, a simulation was conducted on an electric potential of the resistor element and an electric potential appearing on the surface of the semiconductor substrate to give the potential curves shown in FIG. 26(c).

The inventor invented the present invention in thinking of making the electric potentials appearing at portions of the start resistor (the resistor element) SR and the electric potentials appearing at portions on the surface of the semiconductor substrate which correspond to the portions on the start resistor (the resistor element) SR agree with each other, or making the latter potentials are approximately close to the former potentials.

It is thus an object of the present invention addressing the problems described above to provide a semiconductor device including an embedded resistor element having a high withstand voltage and a high resistance value and to provide a method of manufacturing the semiconductor device.

It is another object of the present invention to provide a semiconductor device provided with an embedded resistor element having a high withstand voltage and a high resistance value and used for a switching regulator and to provide a method of manufacturing the semiconductor device.

It is a further object of the present invention to provide a technology of allowing a resistor element having a high withstand voltage and a high resistance value to be manufactured without increasing the size of a semiconductor device including the resistor element.

The above and other objects as well as novel characteristics of the present invention will become more apparent from a careful study of this specification with reference to accompanying diagrams.

Outlines of representatives of the present invention disclosed in this specification are briefly described as follows.
1: A semiconductor device comprises:

a semiconductor substrate including an active area, in which a transistor is created, and a periphery area enclosing the active area and having a surface covered by a field insulation film;

a plurality of field limiting rings (FLRs) which are provided on the surface of the semiconductor substrate in the periphery area and enclose the active area in a multiplexed state;

a resistor element created on the field insulation film, being extended in a direction from an inner side of a group of said FLRs to an outer side of the group and connected between a first electrode having a low electric potential of the transistor and a second electrode having a high electric potential of the transistor where the first electrode is a start edge on the inner side of the group of said FLRs and the second electrode is an end edge on the outer side of the group of said FLRs;

an interlayer insulation film covering the resistor element; and a field plate created on the interlayer insulating film at a location corresponding to the FLR on the outermost circumference and electrically connected to the FLR on the outermost circumference, wherein, if the resistor element were replaced by a hypothetical equivalent resistor element having a shape of a straight segment connecting the start and end edges of the resistor element, a value of resistance per unit length in a portion of the segment would be different from a value of resistance per unit length in another portion of the segment.

Typically, electric potentials appearing at portions of the hypothetical equivalent resistor element having the shape of a straight segment connecting the start and end edges of the resistor element agree with or are approximately close to electric potentials appearing at portions of the surface of the semiconductor substrate, which correspond to the portions of the hypothetical equivalent resistor element. The sheet resistance of the resistor element is 10 kΩ/□ or less.

An implementation of the semiconductor device described above has:

a first terminal to which a signal is supplied;

a second terminal to which a reference electric potential is supplied;

a control terminal;

a current-sensing terminal;

a starter-circuit control terminal for a starter circuit;

a second starter-circuit terminal to which a reference electric potential of the starter circuit is supplied;

a main-switch transistor serving as a main switch and comprising: a main-switch first electrode connected to the first terminal; a main-switch second electrode connected to the second terminal; a main-switch control electrode connected to the control terminal; and a current-sensing electrode connected to the current-sensing terminal and used for sensing a current output by the main-switch first electrode;

a starter-switch transistor serving as a starter switch and comprising: a starter-switch first electrode connected to the first terminal; a starter-switch second electrode connected to the second starter-circuit terminal; and a starter-switch control electrode connected to the control terminal; and a start resistor connected in series between the first terminal and the starter-switch control electrode, wherein the start resistor has the same configuration as the resistor element employed in the semiconductor device described above.

To put it concretely, the resistor element has a zigzag portion between the start and end edges of the resistor element and the zigzag portion has a zigzag pitch varying from location to location. The resistance values per unit length of the resistor segments on the inner and outer sides sandwiching the field limiting ring on the outermost circumference are different from each other.

The configuration of the resistor element has a variety of implementations as follows:

a: In addition to the zigzag portion, the resistor element has a wide zigzag portion with a large zigzag width and a narrow zigzag portion with a small zigzag width.

b: The resistor element has a zigzag portion and a straight portion along the hypothetical segment between the start and end edges of the resistor element.

c: The resistor element has a resistor-line width varying from location to location.

d: The resistor element is a resistor element having a shape like a straight line along the hypothetical segment and a line width at a specific location different from the rest.

e: The resistor element is made of a poly-silicon layer doped with impurities as an additive.

f: The resistor element is made of a metallic portion and a poly-silicon layer doped with impurities as an additive and connected to the metallic portion.

g: The resistor element has a sheet-resistance value varying from location to location.

h: The thickness of the field insulation film, on which the resistor element is created, is set in the range about 3 to 5 μm to reduce the intensity of an electric field developed between a location on the resistor element and the corresponding location on the surface of the semiconductor substrate.

Such semiconductor devices are fabricated by adopting the following methods.

A method is adopted for manufacturing a semiconductor device comprising:

a transistor created in an active area of a main surface of a semiconductor substrate; and a plurality of field limiting rings provided to enclose the active area in a multiplexed state.

The method comprises processes of:

creating the field limiting rings enclosing the active area of a main surface of the semiconductor substrate in a multiplexed state;

creating a field insulation film at a predetermined location and in a periphery area of the semiconductor substrate; and creating a resistor layer on the field insulation film, being extended in a direction from a start edge on an inner side of a group of said field limiting rings to an end edge on an outer side of the group to be used for creating a resistor element connected to the transistor.

In the method described above, the resistor layer is created into such a pattern that, if the resistor element were replaced by a hypothetical equivalent resistor element having the shape of a straight segment connecting the start and end edges of the resistor element, a value of resistance per unit length in a portion of the segment is different from a value of resistance per unit length in another portion of the segment.

The resistor layer is created into such a pattern that electric potentials appearing at portions of the hypothetical equivalent resistor element having the shape of a straight segment connecting the start and end edges of the resistor element agree with or are approximately close to electric potentials appearing at portions of the surface of the semiconductor substrate, which correspond to the portions of the hypothetical equivalent resistor element.

Any of the following patterns can be created on the resistor layer by creation of a conductor layer, patterning and deposition using a mask: a zigzag pattern, a zigzag pattern with a zigzag pitch at a specific location different from the rest, a zigzag pattern with a zigzag width at a specific location different from the rest, a pattern combining any of the above patterns with a straight-line portion, any of the above patterns with a resistor-line width varying from location to location and a straight-line pattern with a resistor-line width varying from location to location.

The transistor is created as a field effect transistor and, in a process to form a gate electrode of the transistor from a poly-silicon layer, the resistor layer is created at the same time from the poly-silicon layer and, if necessary, the value of sheet resistance is adjusted by doping with impurities as an additive.

2: In configuration 1 described above, the resistance of the hypothetical equivalent segment resistor having the shape of a straight line connecting the start and end edges of the resistor element is set so that the resistance value per unit length varies along the segment like a staircase that electric potentials appearing at locations on the resistor element agree or are approximately close to electric potentials appearing at locations on the surface of the semiconductor substrate.

3: In configuration 1 or 2 described above, each of the field limiting rings is connected to the resistor element's portion corresponding to the field limiting ring.

In the manufacture of such a semiconductor device, after creation of a field limiting film, a field insulation film, a resistor layer, and an interlayer insulation film covering the resistor layer, contact holes are formed by boring the interlayer insulation film and conductors are selectively created on the interlayer insulation film to electrically connect the field limiting rings to the resistor element's portions corresponding to the respective field limiting rings through the contact holes.

In accordance with a first configuration 1 described above, (a) Electric potentials appearing at locations on the hypothetical equivalent segment resistor having the shape of a straight line connecting the start and end edges of the resistor element agree or are approximately close to electric potentials appearing at locations on the surface of the semiconductor substrate which correspond to the respective locations on the hypothetical equivalent segment resistor. Thus, hole-electron pairs generated in bulk are not attracted by an electric field to a specific location even if a high voltage is applied to the resistor element serving as a start resistor. As a result, generated pairs of holes and electrons of the pairs recombine, neutralizing each other. Therefore, no channel is developed between the field limiting rings so that the withstand voltage is stabilized, preventing the strength to withstand a voltage from deteriorating.

(b) By setting the sheet resistance of the resistor layer on which the start resistor is created at 10 kΩ/□ or smaller, it is possible to avoid an increase in temperature caused by a decrease in resistance. Thus, the amount of dissipated heat at a certain applied voltage can be stabilized. In addition, by forming the resistor layer into a zigzag shape, it is possible to increase the length of the resistor layer. With the length increased, the area dissipating heat is widened so that the heat dissipation efficiency is also raised. As a result, it is possible to avoid a destruction incident caused by fusion of the poly-silicon layer serving as the resistor layer due to dissipated heat.

(c) With schemes (a) and (b) described above, it is possible to provide a highly reliable semiconductor, that is, a driving power IC used in a switching regulator.

(d) Since the start resistor is created on the field insulation film on the periphery area instead of the active area, the size of the semiconductor chip can be made small and the cost of manufacturing the semiconductor device can also be reduced in comparison with a structure wherein the start resistor is created on the active area.

In accordance with configuration 2 described above, it is possible to prevent the strength to withstand a voltage from deteriorating and avoid a destruction incident caused by heat dissipated by the poly-silicon layer serving as the resistor layer as is the case with configuration 1.

In accordance with configuration 3 described above, the field limiting rings are electrically connected to the resistor element's portions corresponding to the respective field limiting rings so that, at each of the connections, the electric potential of the field limiting ring is equal to the electric potential of the resistor element's portion electrically connected to the field limiting ring. Thus, electric potentials appearing at locations on the segment resistor agree or are approximately close to electric potentials appearing at locations on the surface of the semiconductor substrate which correspond to the respective locations on the segment resistor as is the case with configuration 1. As a result, it is possible to avoid a destruction incident caused by heat dissipated by the poly-silicon layer serving as the resistor layer

DETAILED DESCRIPTION OF THE PREFERRED EMBODIMENTS

Figure 1A:
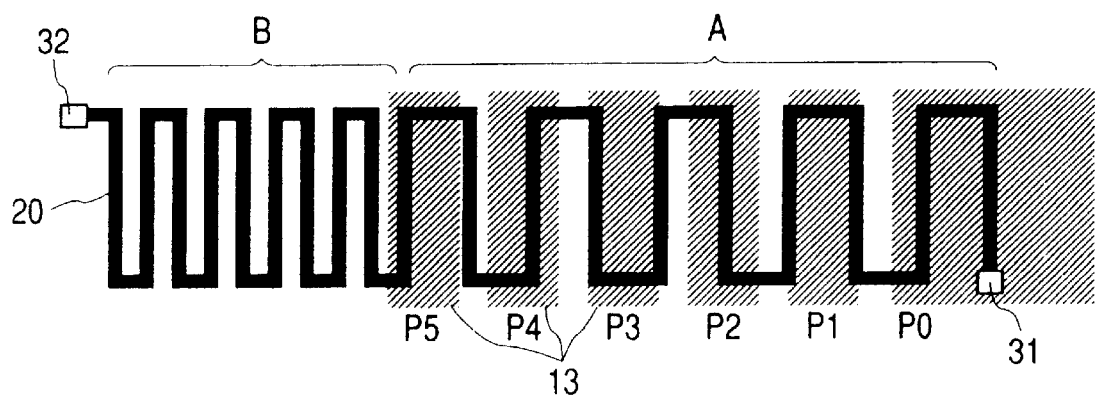
FIG. 1(a) is a diagram showing a top view of a start resistor of a semiconductor device used as a driving power IC as implemented by a first embodiment of the present invention.

Some preferred embodiments of the present invention are described in detail by referring to the diagrams as follows. It should be noted that throughout all figures referred to in the description of the embodiments, components having functions identical to each other are denoted by the same reference numeral or notation and explanation is not repeated for each of such components.

First Embodiment

FIGS. 1 to 16 are each a diagram in accordance with a first embodiment of the present invention.

A semiconductor apparatus implemented by the first embodiment is configured as a driving power IC of a switching regulator. The driving power IC comprises a main switch MS and a starter circuit for starting the main switch MS. The starter circuit comprises a starter switch SS and a start resistor (a resistor element) SR. The main switch MS is implemented by MISFETs (or MOSFETs) while and the starter switch SS is implemented by a MISFET (or a MISFET). The start resistor SR has a sheet-resistance value of 10 k$\Omega$/□, suppressing an increase in amount of dissipated heat. The start resistor SR is also created into a zigzag shape to increase its length and its area of heat dissipation. As a result, it is possible to a void a damage caused by heat dissipated by the poly-silicon layer used as a resistor layer.

Figure 2:
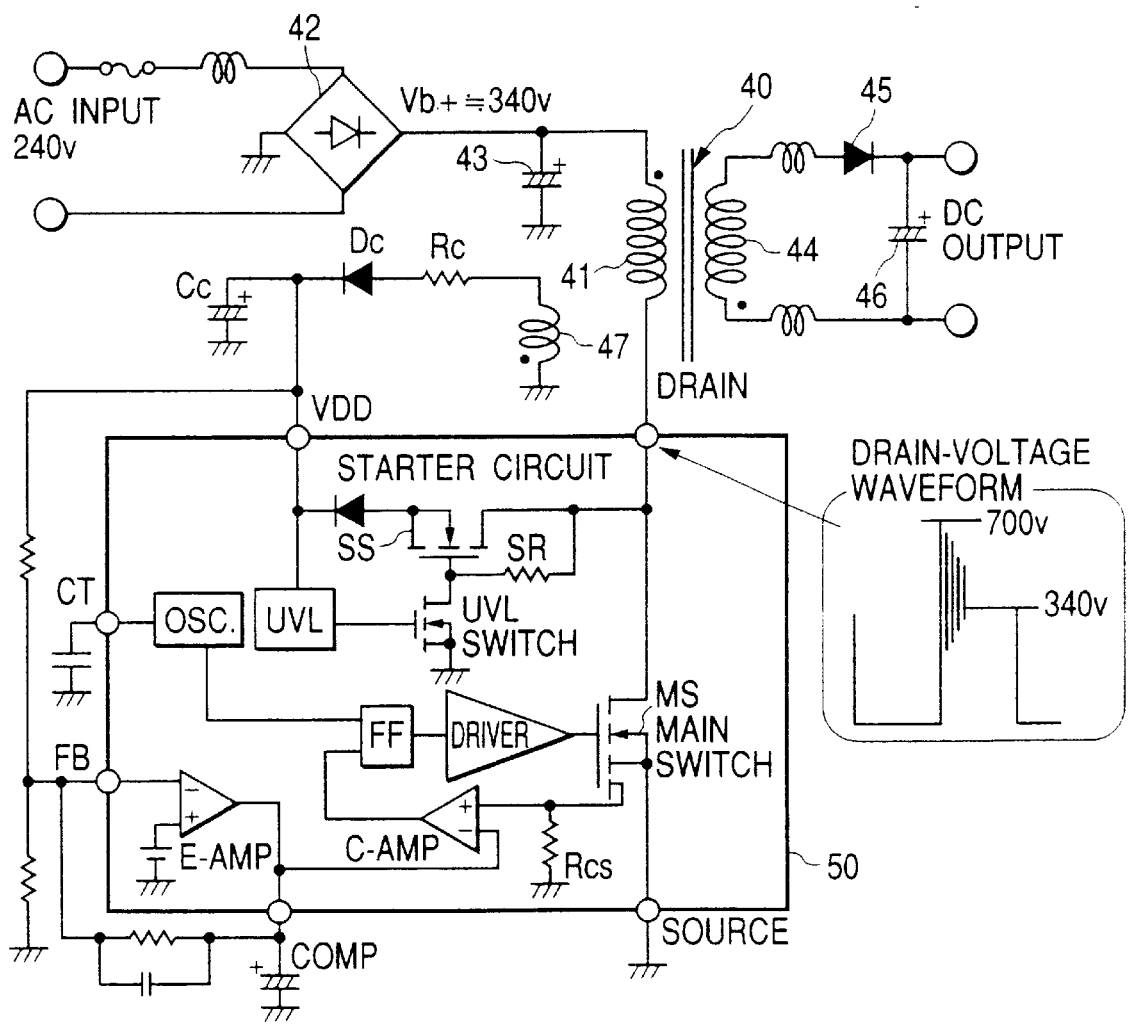
FIG. 2 is a diagram showing a switching-regulator circuit including an embedded driving power IC in the first embodiment.

FIG. 2 is a diagram showing a switching-regulator circuit including an embedded driving power IC in the first embodiment. Only important components of the circuit are explained as follows. A full-wave rectification circuit is created between an input terminal receiving an alternating-current commercial power supply of typically 240 V and the primary coil 41 of a transformer 40. The full-wave rectification circuit comprises a diode bridge rectification circuit 42 and a smoothing capacitor 43. The secondary coil 44 of the transformer 40 is connected to a half-wave rectification circuit comprising a diode 45 and a smoothing capacitor 46. The half-wave rectification circuit outputs a direct-current voltage through an output terminal.

The primary coil 41 is connected to a drain pin of a control IC serving as pulse-width control circuit 50. In addition to the drain pin, the pulse-width control circuit 50 has a power-supply (VDD) pin, a source pin, a comparator (COMP) pin, a capacitor-of-timing (CT) pin and a feedback (EB) pin. In the pulse-width control circuit 50, a main switch MS is connected between the drain and source pins. A start resistor SR is connected between the gate electrode of a starter switch SS and the drain pin. The start resistor SR and the starter switch SS constitute a starter circuit. When a voltage appearing at the drain pain increases to a certain degree, the operation of the starter circuit is commenced.

The output electrode of the starter switch SS is connected to a UVL (Under Voltage Lockout) circuit. The UVL circuit is connected to a UVL switch wired to the gate electrode of the starter switch SS. When the UVL circuit operates, the UVL switch is actuated to turn off the starter switch SS.

An embedded oscillator (Osc.) is connected to the CT pin. An embedded error amplifier (E-AMP) is connected between the FB and COMP pins. A signal output by the error amplifier and a detection signal CS generated by the main switch MS are supplied to a comparison amplifier (C-AMP). The detection signal CS flows to a resistor RCS as a current, being converted into a voltage. A backup output voltage approximately equal to a voltage appearing at the VDD pin is supplied to the FB pin connected to the error amplifier as a feedback signal.

Signals output by the oscillator and the comparison amplifier are supplied to a flip-flop circuit (FF). A signal generated by the flip-flop circuit is supplied to the gate electrode of the main switch MS to turn the main switch MS on or off.

The VDD pin of the pulse-width control circuit 50 is connected to a backup power-supply circuit. The backup power-supply circuit comprises a diode Dc, a resistor Rc and a capacitor Cc which are connected in series to a tertiary coil (backup coil) 47 of the transformer 40. When a direct-current voltage is applied to the primary coil 41, an electric-potential-charging circuit builds up an electric potential on the capacitor Cc as follows. The starter circuit employed in the pulse-width control circuit 50 operates to electrically charge the capacitor Cc. The operation to electrically charge the capacitor Cc continues and, as the voltage of the capacitor Cc reaches a release voltage, the UVL circuit operates, turning on the UVL switch. With the UVL switch turned on, the starter switch SS is turned off and an operation to turn the main switch MS on and off is started. In the mean time, a voltage is induced in the backup coil 47, the voltage serves as a power supply, and the operation of the pulse-width control circuit 50 is continued.

A characteristic of the backup output voltage technique adopted in this fly-back system makes use of a property exhibiting the fact that the backup output voltage is proportional to a ratio of the number of turns in the backup coil 47 to the number of turns in the primary coil 41 of the transformer 40 and that the secondary output voltage is proportional to a ratio of the number of turns in the secondary coil 44 to the number of turns in the primary coil 41 of the transformer 40.

With the pulse-width control circuit 50 operating in a current mode, a pulse duty is controlled by adjusting the current detection level of the power MOSFET in accordance with the output terminal voltage of the error amplifier.

Figure 3:
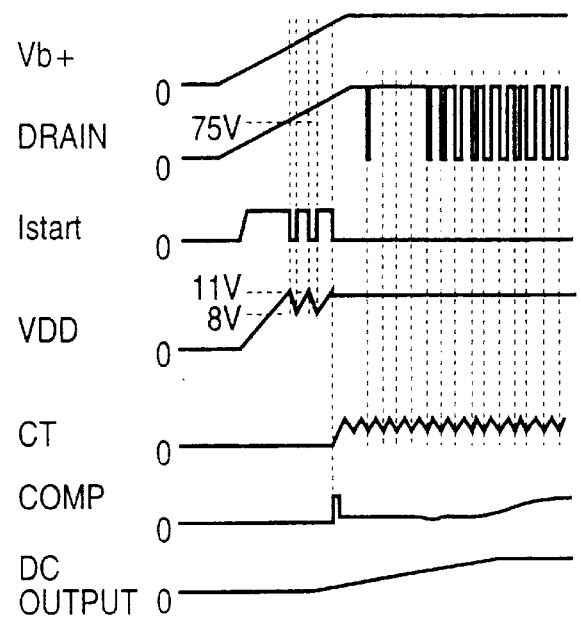
FIG. 3 is timing charts showing a start timing of the switching regulator in the first embodiment.

FIG. 3 is timing charts showing a start timing of the switching regulator in the first embodiment. To be more specific, FIG. 3 shows variations in voltage of $Vb^+$, DRAIN, Istart, VDD, CT, COMP and direct-current OUTPUT. $Vb^-$ is a voltage obtained as a result of rectification by the full-wave rectification circuit.

In such a switching regulator, the 240-VAC input of the commercial power supply is rectified to yield the voltage $Vb^+$ which is controlled by operating the pulse-width control circuit 50 in accordance with the start timing shown in FIG. 3 to produce a predetermined direct-current voltage. FIG. 2 also shows a typical waveform of the voltage appearing on the drain pin of the pulse-width control circuit 50.

Figure 4:
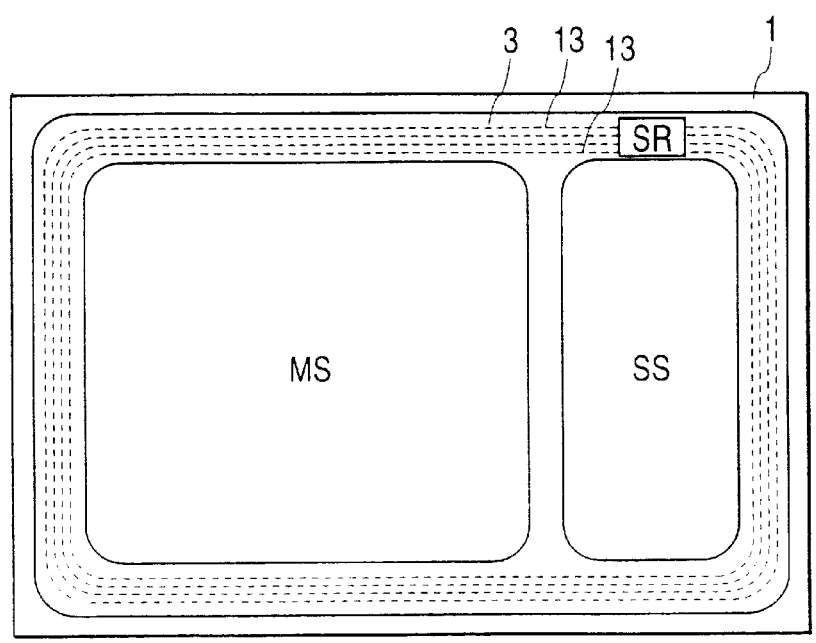
FIG. 4 is a diagram showing the top view of a model of the driving power IC in the first embodiment.

FIG. 4 is a diagram showing the top view of a model of the semiconductor device in the first embodiment. To be more specific, the figure shows the top view of a model of the driving power IC monolithically created on a silicon semiconductor substrate 1 and composed of a main switch MS, a starter switch SS and a start resistor SR which constitute a high-voltage unit of a switching regulator.

In a semiconductor chip wherein a driving power IC is created, the inner side of a periphery area is used as an active area in which the main switch MS and the starter switch SS are created. Made of a LOCOS film, a field insulation film 3 is provided between the periphery area and these MS & SS switches. In a main surface of the semiconductor substrate 1 beneath the field insulation film 3, a plurality of FLRs 13 are provided, enclosing the active area in a multiplexed state. The start resistor (resistor element) SR extends in a direction from a start edge on the inner side of the group of said multiplexed FLRs 13 to an end edge on the outer side of the group of said multiplexed FLRs 13.

Figure 6:
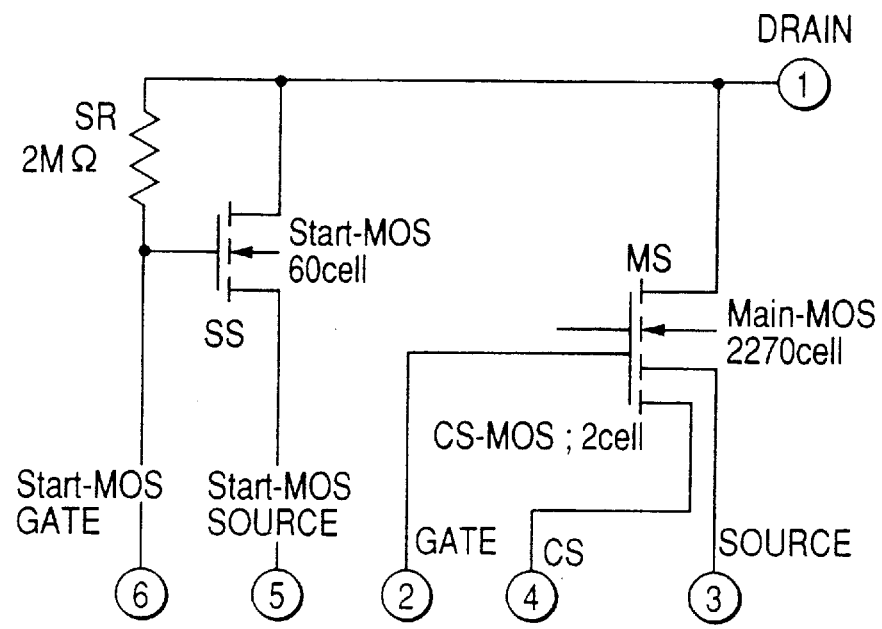
FIG. 6 is a diagram showing an equivalent circuit of the driving power IC in the first embodiment.

FIG. 6 is a diagram showing an equivalent circuit of the driving power IC in the first embodiment. The driving power IC has 6 pins 1 to 6. Pin 1 is a first pain or a drain pin outputting a signal. Pin 2 is a gate pin serving as a control pin. Pin 3 is a second pin or a source pin to which a reference electric potential GND is supplied. Pin 4 is s current-sensing (CS) pin. Pin 5 is a starter-circuit second pin (start-MOS source pin) for starting a control circuit. Pin 6 is a starter-circuit control pin (start-MOS gate pin).

Figure 5:
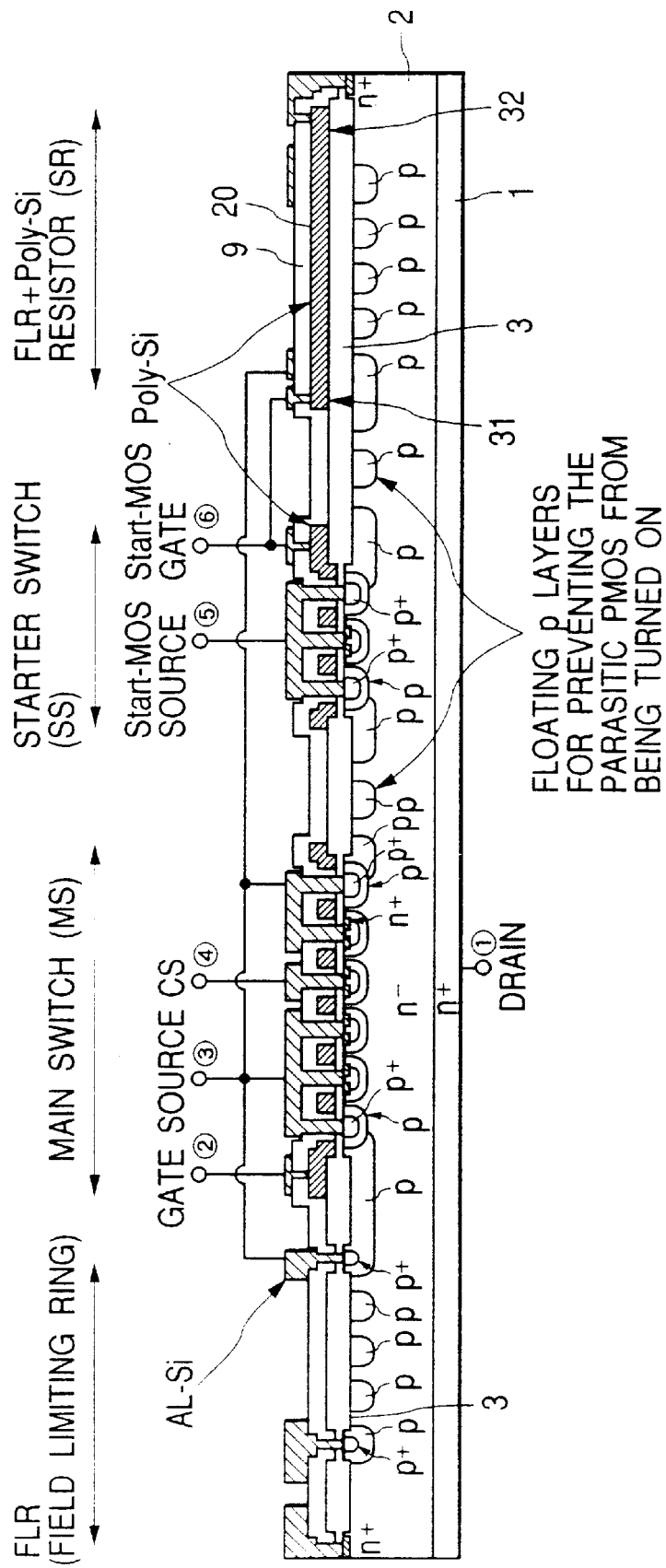
FIG. 5 is a diagram showing the cross section of the model of the driving power IC in the first embodiment.
Figure 7:
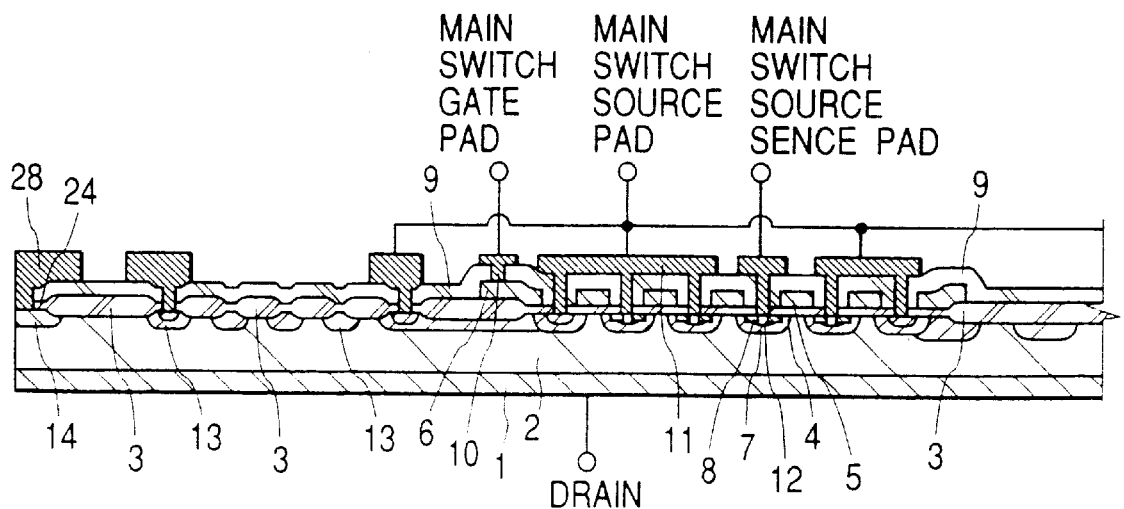
FIG. 7 is a diagram showing a cross section of the driving power IC's portion including a transistor serving as a main switch.
Figure 8:
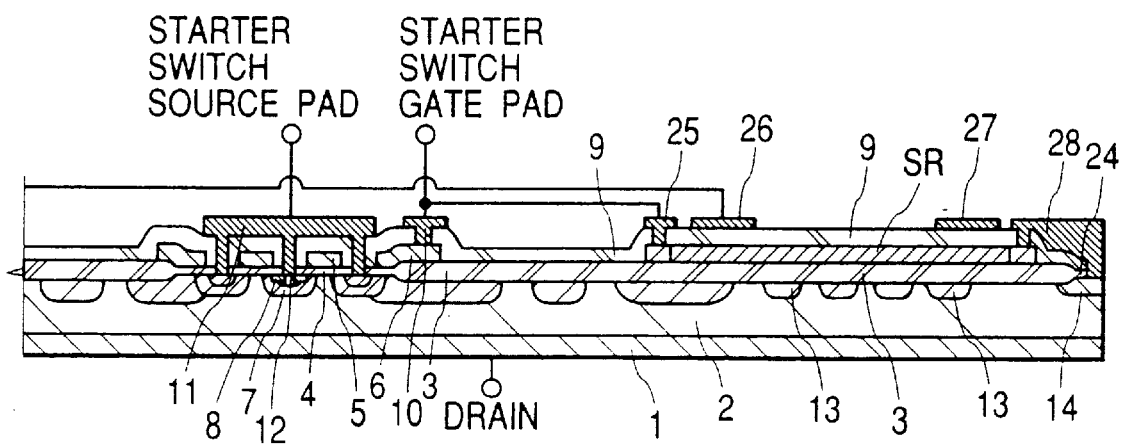
FIG. 8 is a diagram showing a cross section of the driving power IC's portion including a starter switch and a start resistor.

As shown in FIGS. 5, 7 and 8, the main switch MS and the starter switch SS are configured as vertical MISFETs (MOSFETs) and a MISFET (MOSFET) respectively. Each of the MISFETs (MOSFETs) comprises a number of cells. The cell structure is typically a mesh-gate structure.

The main switch MS comprises a main MOS consisting of 2,270 cells and a 2-cell current-sensing (CS) MOS for detecting a current even though the structure of the main switch MS is not limited this configuration. A drain electrode (or a first electrode) of the main MOS is connected to the drain pin. A source electrode (or a second electrode) of the main MOS is connected to the source pin. A source electrode of the CS MOS is connected to the CS pin. A gate electrode of the main switch MS is connected to the gate pin.

The starter switch SS is a start MOS comprising 60 cells even though the structure of the starter switch SS is not limited this configuration. A starter-switch drain electrode (or a starter-switch first electrode) of the start MOS is connected to the drain pin. A starter-switch source electrode (or a starter-switch second electrode) of the start MOS is connected to a start-MOS source pin. A starter-switch gate electrode of the starter switch SS is connected to a start-MOS gate pin.

A start resistor SR having a resistance value of 2 MΩ is connected between the drain pin and the starter-switch gate electrode of the starter switch SS.

Next, the structure of the driving power IC is explained by referring to FIGS. 5, 7 and 8. FIG. 5 is a diagram showing the cross section of the model of the driving power IC in the first embodiment. FIG. 7 is a diagram showing a cross section of the driving power IC's portion including a transistor serving as a main switch MS. FIG. 8 is a diagram showing a cross section of the right half of the driving power IC's portion including the starter switch SS and the start resistor SR.

As shown in these figures, the main surface of a semiconductor substrate made of $n^+$ silicon includes an $n^-$ epitaxial layer 2. The main switch MS and the starter switch SS are formed sequentially by selectively doping the $n^-$ epitaxial layer 2 with predetermined impurities. That is, a plurality of cells each having a planar structure are laid out regularly over an active area. Gates 5 of adjacent cells provided on a gate insulation film 4 formed on the main surface are connected to each other to create a mesh gate structure wherein the cells are connected in parallel. The gates 5 of cells on a circumference are connected to a gate wire 6 made of typically poly-silicon on the periphery of the cell area. The gate wire 6 is connected to a gate pad which is a connection area of the gates 5.

The cells over the $n^-$ epitaxial layer 2 cover a MOSFET's drain area, base area and source area. A p layer 7 created on the main surface of the semiconductor substrate 1 forms a channel in the base area. The source area is an $n^+$ layer 8 created on the p layer 7. The MOSFET is a FET with a vertical structure. Since the semiconductor substrate 1 serves as a drain, a drain electrode is formed on the entire back surface of the semiconductor substrate 1 as shown in none of the figures. The drain electrode is created as a stacked-layer film comprising stacked layers each made of typically nickel, titan, nickel and silver respectively.

The gate wire 6 protrudes to an upper layer through an interlayer insulation film 9, being electrically connected to a gate guard ring 10 made of typically aluminum including silicon. An $n^+$ layer 8 serving as a source is electrically connected to a source wire 11 made of typically aluminum including silicon. The source wire 11 is created over the interlayer insulation film 9 on the main surface of the semiconductor substrate 1. In addition, the $n^+$ layer 8 serving as a source is also electrically connected to a $p^+$ contact layer 12 provided on the p layer 7 in order to keep an electrical potential of the base at a fixed level.

Beneath the field insulation film 3, a plurality of concentric field limiting rings (FLRs) 13 are provided. Each of the FLRs 13 is formed along a circumference of the semiconductor substrate 1 and has a rectangular-ring-like shape with the corners thereof each forming an arc. The FLRs 13 are each made of a p diffusion layer. The FLRs 13 constitute a structure wherein, as a voltage applied thereto increases, a punch-through depletion layer is built, extending in a direction from an inner-circumference one of the FLRs 13 to an outer-circumference one thereof prior to occurrence of an avalanche breakdown and, eventually, a breakdown occurs at a junction portion of the FLR 13 on the outermost circumference.

In addition, as described earlier, it is desirable to have a breakdown inevitably caused by a high applied voltage occur at a portion other than the surface of a device in case the device has a large area. It is thus necessary to avoid a breakdown at FLRs in a device with a small area prone to a breakdown. In order to let an unavoidable breakdown occur in a power MISFET (or MOSFET) which has a large area and is proof against breakdowns, the withstand voltage of the power MISFET is set at a value in the range 750 V to 800 V. For this reason, the withstand voltage of an FLR 13 is set at at least 800 V.

Since the breakdown voltage of an FLR 13 is logically the sum of a punch-through withstand voltage between the FLRs 13 and the breakdown voltage of the ring on the outermost circumference, the breakdown voltage of an FLR 13 can be increased by raising the number of FLRs 13. However, the number of FLRs 13 is determined by taking a termination length into consideration. While the number of FLRs 13 is 5 in FIG. 1 and the number of FLRs 13 is 4 in other figures, these numbers are typical to the bitter end.

The start resistor SR is created on a portion of the field insulation film 3 formed earlier. As shown in FIG. 1(a), the resistor layer 20 serving as the start resistor (resistor element) SR extends in a direction from a start edge 31 on the inner side of the group of said FLRs 13 to an end edge 32 on the outer side of the group of said FLRs 13. In addition, the start resistor SR is formed into a zigzag shape to increase its length and, hence, its heat-dissipating area and to improve its heat-dissipation characteristic. In the example shown in the figure, five FLRs 13, namely, P1 to P5, are created even though the number of FLRs is not limited to 5.

Figure 1B:
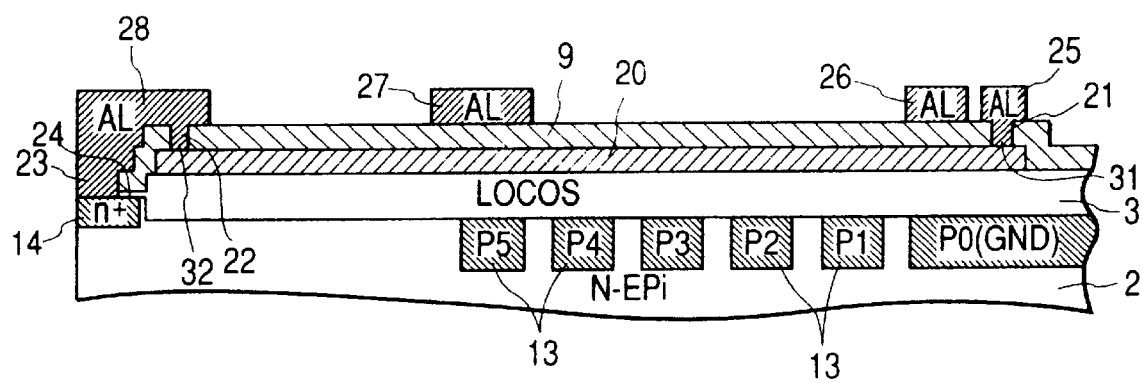
FIG. 1(b) is a diagram showing a cross section of the start resistor and FIG. 1(c) is a diagram showing electric potentials at portions of the start resistor.
Figure 1C:
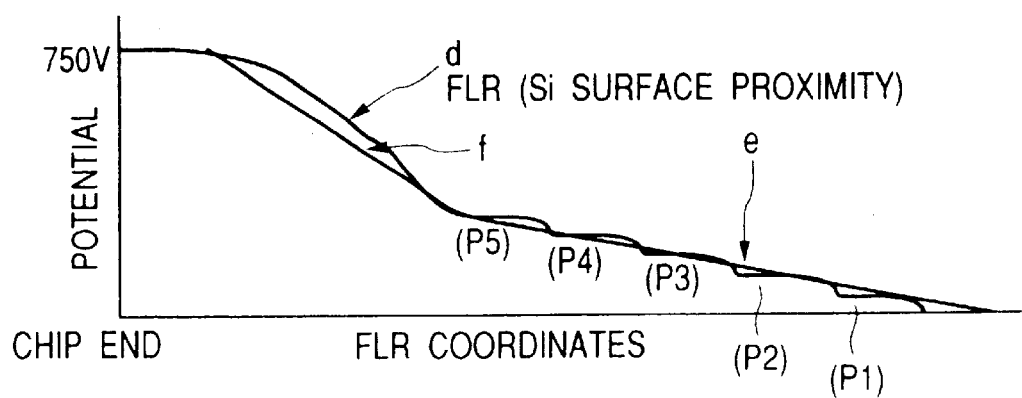

FIG. 1(a) is a diagram showing a model of a zigzag pattern of a resistor layer serving as the start resistor (resistor element) SR. FIG. 1(b) is a diagram showing a cross section of the driving power IC's portion including the FLRs and the resistor layer. FIG. 1(c) is a diagram showing graphs representing electric potentials appearing at portions of the resistor layer and the semiconductor substrate's surface including the FLRs.

With reference to FIG. 1(b), the following description briefly explains the cross section of a periphery portion of a semiconductor chip in which a driving power IC is created. The field limiting rings (FLRs) 13 denoted by reference notations P1 to P5 are each created from a p diffusion layer on the surface of an epitaxial layer 2 in a periphery area in a direction from an active area not shown in the figure to the periphery area to enclose the active area. It should be noted that, on the inner side of the FLR P1, a p diffusion layer P0 is created, being held at a ground electric potential (GND)

In addition, a guard ring 14 is provided on the edge of the semiconductor chip. The guard ring 14 is created on the surface of the n⁻epitaxial layer 2 beneath an insulation film 24 thinner than the field insulation film 3 at a location outside the field insulation film 3. The guard ring 14 is formed in a n⁺ diffusion area with a ring shape by diffusing impurities into the main surface of the n⁻epitaxial layer 2 at a high concentration.

On the field insulation film 3, a resistor layer 20 made of a poly-silicon layer is provided. The surface of the resistor layer 20 is covered by the interlayer insulation film 9. A contact hole 21 is formed by boring a location on the interlayer insulation film 9 above the p diffusion layer P0 and a contact hole 22 is formed by boring a periphery location on the interlayer insulation film 9. A contact hole 23 is formed at a location outside the edge of the field insulation film 3. The contact hole 23 is extended to a location outside the insulation film 24, which is thinner than the field insulation film 3 and provided at a location separated away from the field insulation film 3 as described above.

Conductor films 25 to 28 each having a ring shape are created along the periphery of the semiconductor chip on the interlayer insulation film 9. The conductor film 25 is created on the inner side of the periphery area, that is, on the active-area side of the periphery area. The conductor film 25 also fills up the contact hole 21, being electrically connected to the resistor layer 20. The conductor film 26 is created at a location adjacent to the conductor film 25 on the outer side of the conductor film 25 and is electrically connected to the p diffusion layer P0 held at the ground electric potential GND used as a reference electric potential. The conductor film 27 is created above the FLR 13 on the outermost circumference or the layer P5, being electrically connected to the FLR 13. The conductor film 28 also fills up the contact holes 22 and 23 and is electrically connected to the resistor layer 20 and the guard ring 14.

As an applied voltage is increased in the group of FLRs 13 described above, a depletion layer extends from an FLR 13 on inner circumference to an FLR 13 on an outer circumference before an avalanche breakdown occurs, resulting in a punch-through structure and, eventually, a breakdown occurs at the pn junction of the FLR 13 on the outermost circumference. By providing a group of FLRs 13 as described above, the strength to withstand a voltage can be increased to a product of a punch-through voltage and the number of FLRs 13. Thus, the withstand voltage of the start resistance SR is equal to the sum of the withstand voltage of the portion comprising the FLRs 13 and a withstand voltage due to, among other factors, the thickness of the field insulation film 3. As a result, the start resistance SR has a total withstand voltage of at least 800 V.

A resistor-layer portion corresponding to the contact hole 21 is the start edge 31 of the resistor element serving as the start resistor SR and a resistor-layer portion corresponding to the contact hole 22 is the end edge 32 of the start resistor SR. A pattern of the resistor layer 20 serving as the resistance SR starting from the start edge 31 and ending at the end edge 32 displays a zigzag shape which has a fixed amplitude and changes the direction at fixed pitch intervals as shown in FIG. 1(a). In FIG. 1(b), however, the zigzag shape is not explicitly shown for the sake of simplicity.

By forming the resistor layer 20 into a zigzag pattern as described above, the length of the resistor layer 20 increases, resulting in a greater heat-dissipating area. In addition, by setting the sheet resistance of the resistor layer 20 at 10 kΩ/□, the amount of dissipated heat at a certain voltage can be set at a fixed value. As a result, it is possible to avoid destruction caused by fusion of the poly-silicon layer serving as the resistor layer due to dissipated heat. The resistor layer 20 is designed to into a flattened shape in order to increase the surface area relative to a cross-sectional area by taking heat dissipation into consideration. The resistor layer 20 is made of typically a poly-silicon layer doped with n-conduction impurities such as phosphor and p-conduction impurities such as boron for adjusting the resistance value or the sheet resistance.

The present invention prevents the strength to withstand a voltage from deteriorating by making electric potentials appearing at portions of a hypothetical equivalent segment resistor having the shape of a straight line connecting the start and end edges of the resistor element SR and electric potentials appearing at portions on the surface of a semiconductor substrate which correspond to the portions of the segment resistor agree with each other, or making the latter potentials approximately close to the former potentials.

Thus, in a most desirable configuration, among other modifications, the material (or the sheet resistance), the pattern, the width and the thickness of a resistor layer serving as a resistor element are changed and the thickness of a field insulation film are varied so as to make electric potentials appearing at portions of a hypothetical equivalent segment resistor having the shape of a straight line connecting the start and end edges of the resistor element SR and electric potentials appearing at portions on the surface of a semiconductor substrate which correspond to the portions of the segment resistor agree with each other.

The first embodiment has a configuration wherein the zigzag pitch of the resistor layer 20 at some locations is made different from the rest. To be more specific, the zigzag pitch of the resistor layer 20 for area A is made greater than the zigzag pitch of the resistor layer 20 for area B where area A is an area between the start edge 31 and the FLR 13 on the outermost circumference and area B is an area between the end edge 32 and the FLR 13 on the outermost circumference as shown in FIG. 1(a).

By having such a configuration, straight lines e and f compose a curve representing electric potentials appearing at portions of a hypothetical equivalent segment resistor having the shape of a straight line connecting the start edge 31 and the end edge 32 of the resistor element as shown in FIG. 1(c). The straight line e having a moderate gradient represents electric potentials appearing in area A between the start edge 31 and the FLR 13 on the outermost circumference. On the other hand, the straight line f having a gradient more abrupt than the slope of the straight line e represents electric potentials appearing in area B between the end edge 32 and the FLR 13 on the outermost circumference. The straight lines e and f coincide with a curve d at some locations and approach the curve f at other locations where the curve d represents electric potentials appearing on the surface of the semiconductor substrate. The difference in electric potential between areas A & B and the surface of the semiconductor substrate can be reduced to a level below about typically 50 V at a location where the straight line e or f is separated from the curve f even if a high voltage is applied. As a result, it is possible to avoid a damage caused by a strong electric field of the field insulation film.

The following description gives more explanation. Electric potentials appearing at portions of a hypothetical equivalent segment resistor having the shape of a straight line connecting the start and end edges of the resistor element SR agree with electric potentials appearing at portions on the surface of a semiconductor substrate which correspond to the portions of the segment resistor, or the latter potentials are approximately close to the former potentials. Thus, hole-electron pairs generated in bulk are not attracted by an electric field to a specific location even if a high voltage is applied to the resistor element serving as a start resistor. As a result, generated pairs of holes and electrons of the pairs recombine, neutralizing each other. Therefore, no channel is developed between the field limiting rings so that the withstand voltage is stabilized, preventing the strength to withstand a voltage from deteriorating.

Figure 26A:
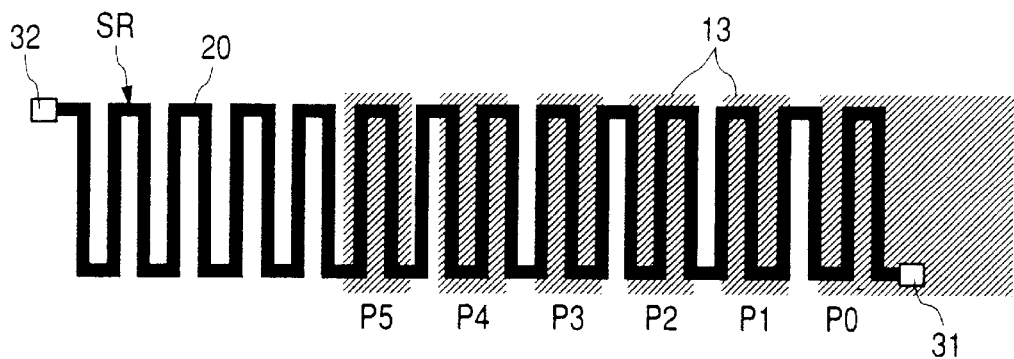
FIG. 26(*a*) is a diagram showing a top view of a start resistor of a semiconductor device used as a driving power IC as proposed by the inventor of the present invention, FIG. 26(*b*) is a diagram showing a cross section of the start resistor and FIG. 26(*c*) is a diagram showing electric potentials at portions of the start resistor.
Figure 26B:
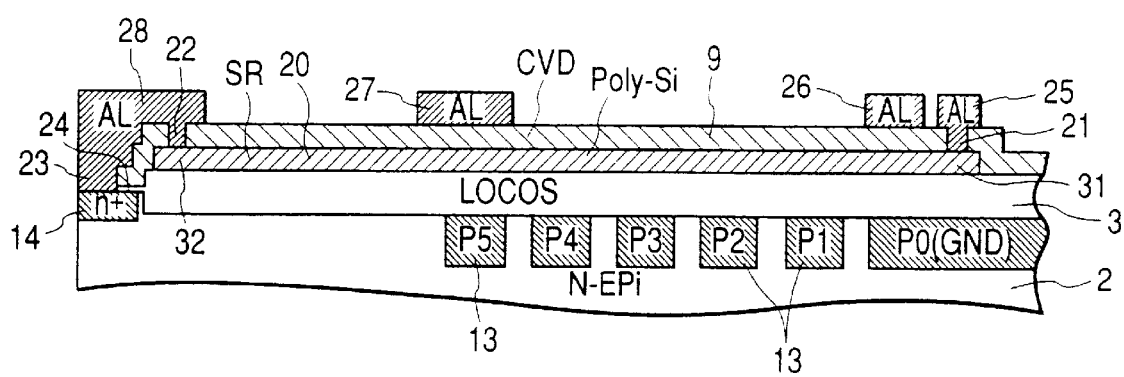
Figure 26C:
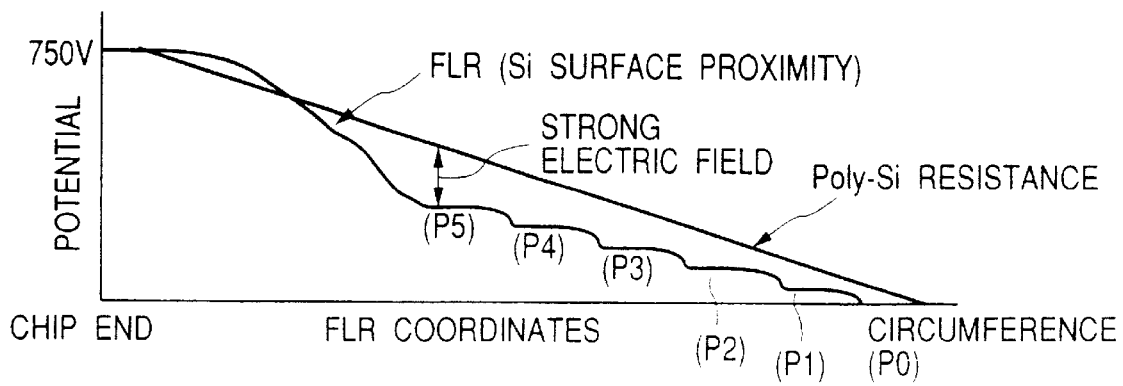
Figure 27:
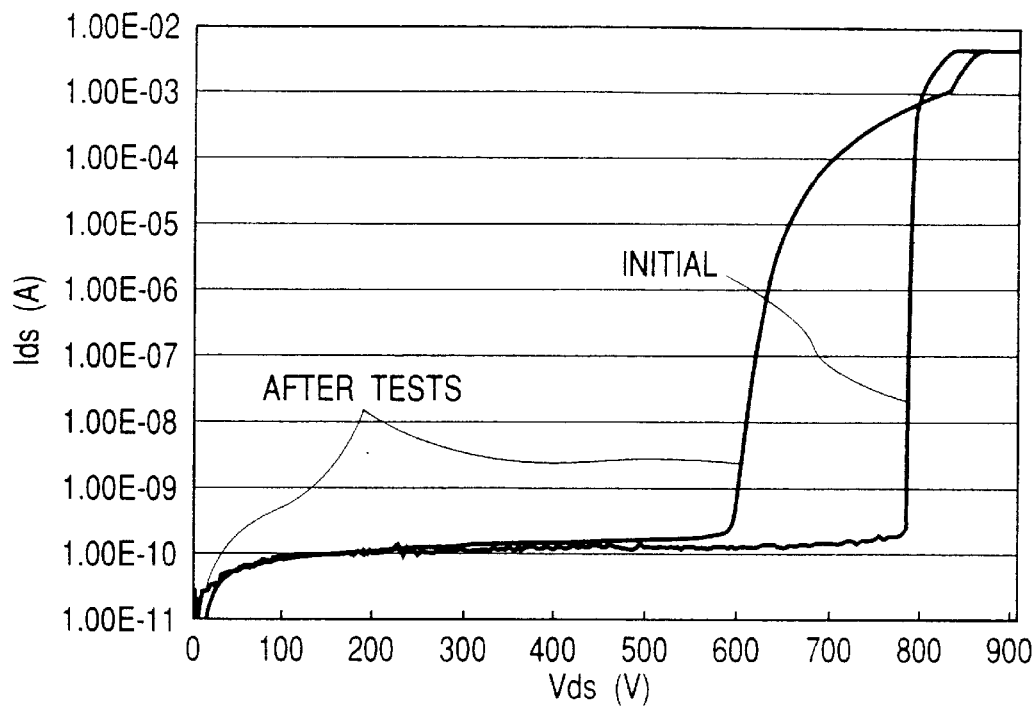
FIG. 27 is a diagram showing graphs used for comparing states of deterioration in the proposed driving power IC.
Figure 28:
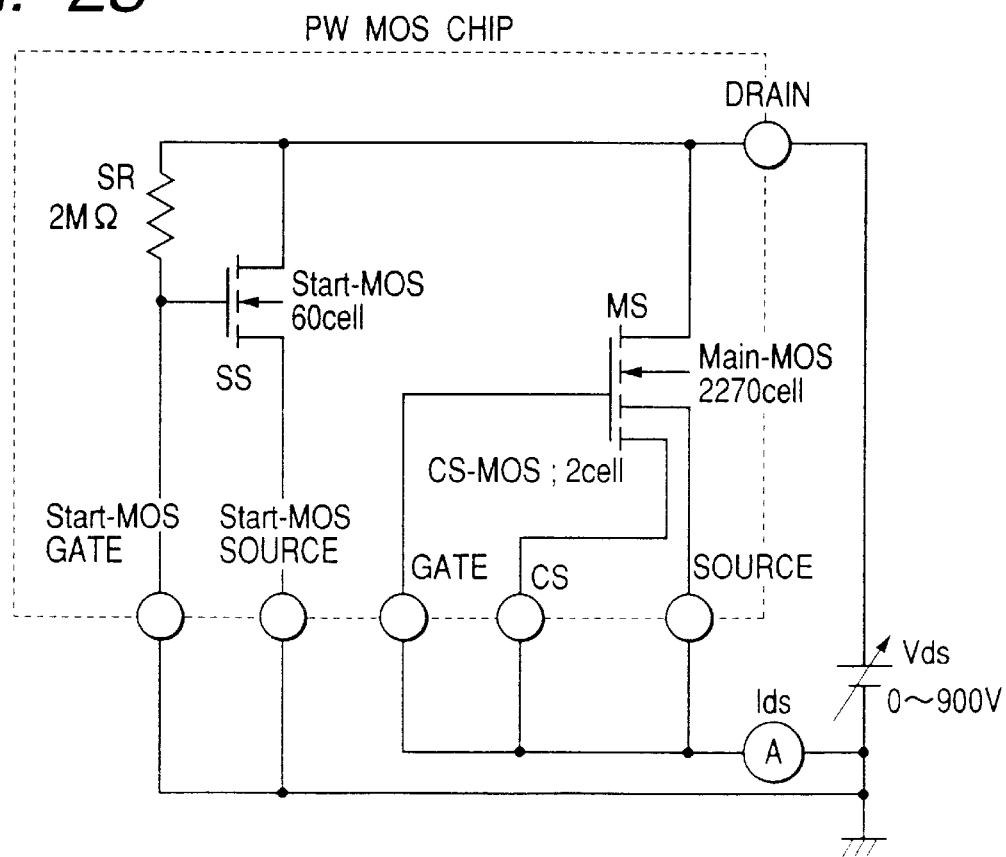
FIG. 28 is a diagram showing a withstand-voltage measuring circuit.

In the first embodiment, as shown in FIG. 26(c) relevant to the technology proposed earlier, a location at which a strong magnetic field is generated is the location of the FLR 13 placed on the outermost circumference and denoted by reference notation P5. Thus, by making the electric potential of the resistor element at the location of the FLR 13 (P5) agree with the electric potential appearing on the surface of the semiconductor substrate, it is possible to make electric potentials appearing at portions of a hypothetical equivalent segment resistor having the shape of a straight line connecting the start and end edges of the resistor element SR agree with electric potentials appearing at portions on the surface of a semiconductor substrate which correspond to the portions of the segment resistor, or to make the latter potentials approximately close to the former potentials. That is, the resistance value per unit length of the segment on the outer side of the FLR 13 on the outermost circumference is made different from the resistance value per unit length of the segment on the inner side of the FLR 13 on the outermost circumference.

In addition, in the first embodiment, the sheet resistance of the resistor layer 20 is made small to avoid breakage caused by thermal fusion. Specifically, the sheet resistance of the resistor layer 20 is made small to prevent the amount of dissipated heat from increasing and, furthermore, the resistor layer 20 is designed into a zigzag shape to increase the length and, hence, the area of thermal dissipation so that breakage caused by thermal fusion can be avoided.

Figure 9:
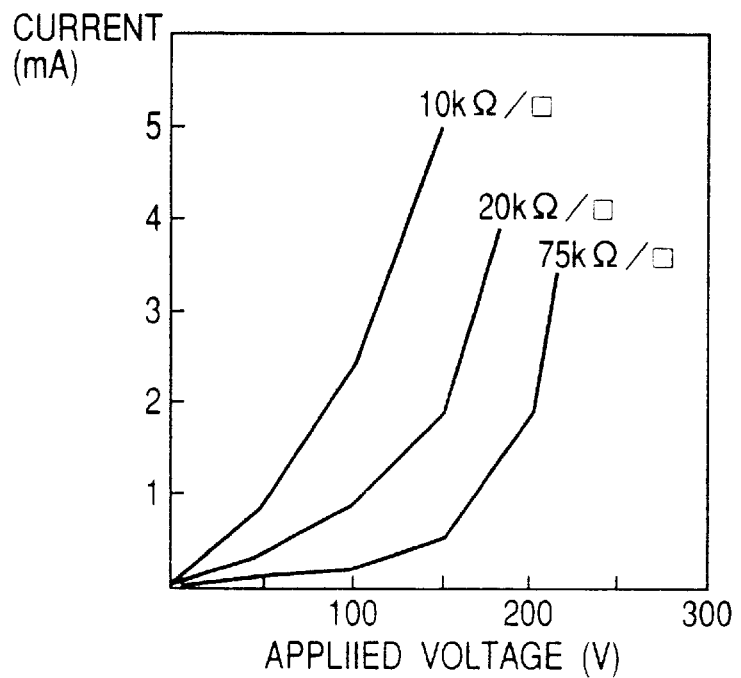
FIG. 9 is a diagram showing graphs each representing a characteristic of a resistor element used as the start resistor in the first embodiment.

FIG. 9 is a diagram showing graphs each representing a voltage versus current characteristic of the start resistor created at different resistance sheets in accordance with the first embodiment. At a high sheet resistance value, as the applied voltage rises, the resistance value decreases due to heat dissipated by the resistor element. Thus, in order to make the voltage versus current characteristic linear, it is necessary to reduce the sheet resistance to a value not exceeding 10 kΩ/□.

Figure 10:
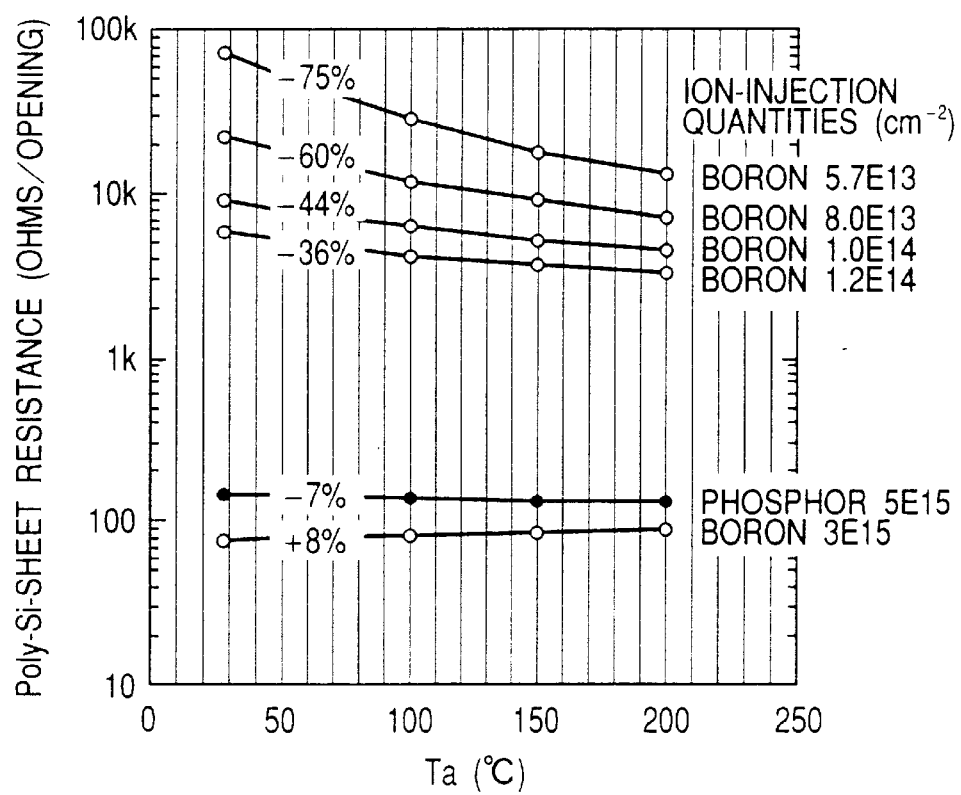
FIG. 10 is diagram showing graphs each representing a characteristic of the resistor element in the first embodiment.

FIG. 10 is diagram showing graphs each representing a temperature versus sheet-resistance characteristic of the resistor element created at different impurity concentrations in accordance with the first embodiment. As is obvious from the graphs, a resistor element having a large sheet resistance has a negative temperature characteristic. In addition, the greater the sheet resistance, the greater the variation in resistance caused by a change in temperature.

Figure 11:
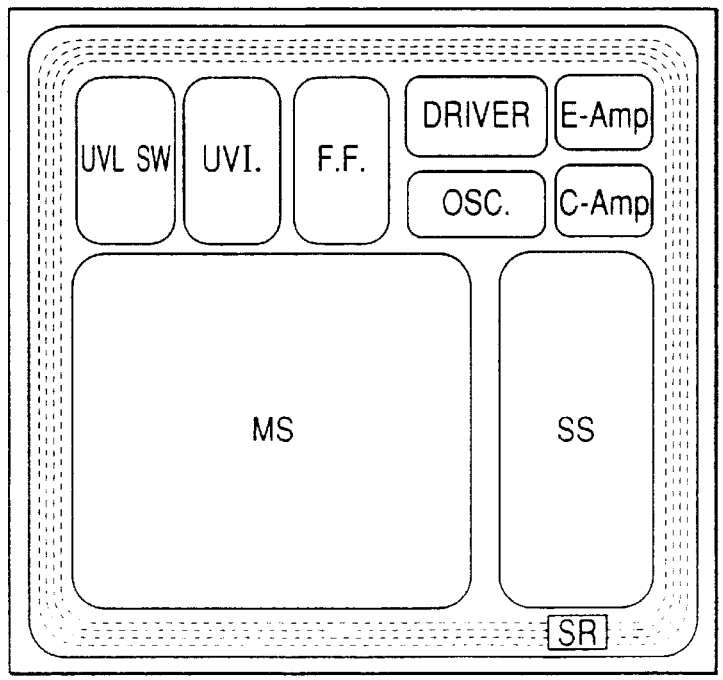
FIG. 11 is a diagram showing a model representing a case in which the driving power IC in the first embodiment is embedded monolithically into a control IC of a switching modulator.

Furthermore, as described above, this embodiment implements a semiconductor device wherein the high-voltage unit of the switching regulator is implemented as an integrated circuit and the control circuit is put in another chip. With such a configuration, it is possible to use a semiconductor substrate proper for the high-voltage unit and a semiconductor substrate appropriate for the control circuit. In further integration of circuits, however, the present invention can also be applied to a semiconductor device of a switching regulator with the control circuit integrated therein as shown in FIG. 11.

Next, a method of manufacturing the driving power IC (or the semiconductor device) is explained by referring to FIGS. 12 to 16. In each of the figures, a MOSFET portion is shown on the left side while a resistor-element (start-resistor) portion created in the same process is shown on the right side.

Figure 12:
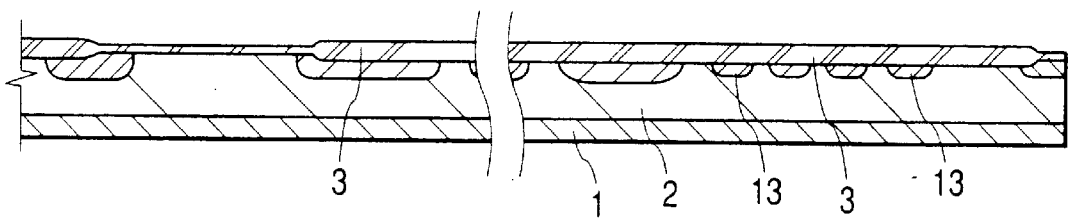
FIG. 12 is a diagram showing the cross section of a model of main elements in a state with FLRs and a field insulation layer formed on the surface of a semiconductor substrate in a process of manufacturing the driving power IC in the first embodiment.
Figure 13:
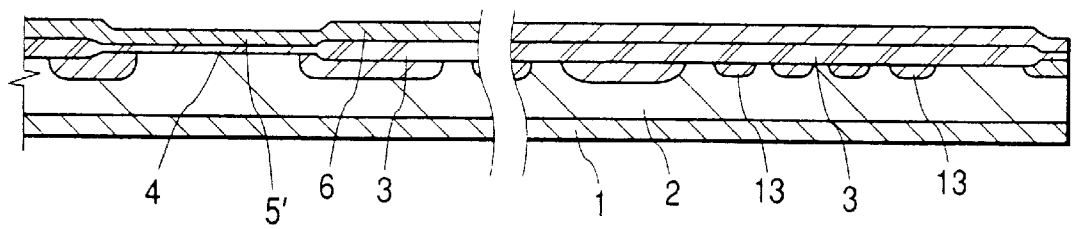
FIG. 13 is a diagram showing the cross section of a model of main elements in a state where the gate electrode of a transistor and a poly-silicon layer serving as the resistor layer of the resistor element are formed in a process of manufacturing the driving power IC in the first embodiment.

First, an n⁻ epitaxial layer 2 is created by using an epitaxial-growth technique on an n⁺ semiconductor substrate 1 made of monolithic silicon with arsenic (As) or the like injected therein. Then, a plurality of FLRs 13 are created in the periphery area of the n⁻ epitaxial layer 2, enclosing an active area of the semiconductor chip by multiplexing p wells, and a silicon-oxide film is formed on the main surface of the semiconductor substrate 1 by adoption of typically a thermal oxidation method. A mask of a silicon-nitride (SiN) is then created on the silicon-oxide film. Subsequently, the field insulation film 3 is formed by selective thermal oxidation with the silicon-nitride film used as a mask. A state after the formation of the field insulation film 3 is shown in FIG. 12.

Next, the gate insulation film 4 is created on the main surface of the semiconductor substrate 1 by stacking thermal-oxide films or silicon-oxide films on a thermal-oxide film by adoption of a CVD (Chemical Vapor Deposition) technique. Then, a poly-silicon film 5' to serve as a conductor film of the resistor element SR and to serve as a gate 5 is created on the entire main surface of the semiconductor substrate 1 by using the CVD technique. In an area of the poly-silicon film 5' to serve as the gate 5, typically, phosphor is introduced. On the other hand, in an area of the poly-silicon film 5' to serve as the conductor film of the resistor element SR, boron is introduced. A state at the end of this process is show in FIG. 13.

Figure 14:
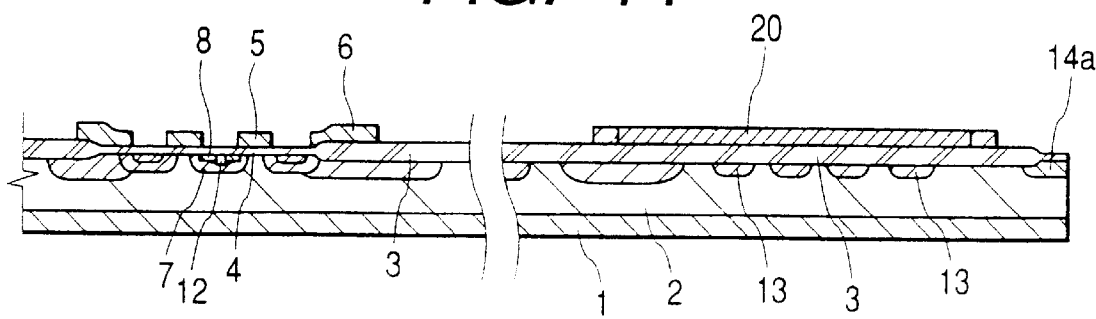
FIG. 14 is a diagram showing the cross section of a model of main elements in a state with the gate electrode and the source area of a transistor and as well as the resistor layer formed in a process of manufacturing the driving power IC in the first embodiment.

Next, the poly-silicon film 5' is selectively etched in a patterning process to form the gate 5 and the resistor layer 20 of the element SR. Then, the MISFET's p layer 7, n⁺ layer 8 and contact layer 12 are created by ion injection using a mask in a photolithography process. In this process, a p⁺ layer is created for reducing the contact-resistance values of the conductor film of the element SR. It should be noted that, in the case of an n conductor film, an n⁺ layer is created instead of creating a p⁺ layer. A state at the end of this process is shown in FIG. 14.

In the process of selectively etching the poly-silicon film 5', a predetermined mask is used to create the resistor film 20 with a zigzag pitch varying at the FLR 13 on the outermost circumference as shown in FIG. 1(a).

Figure 15:
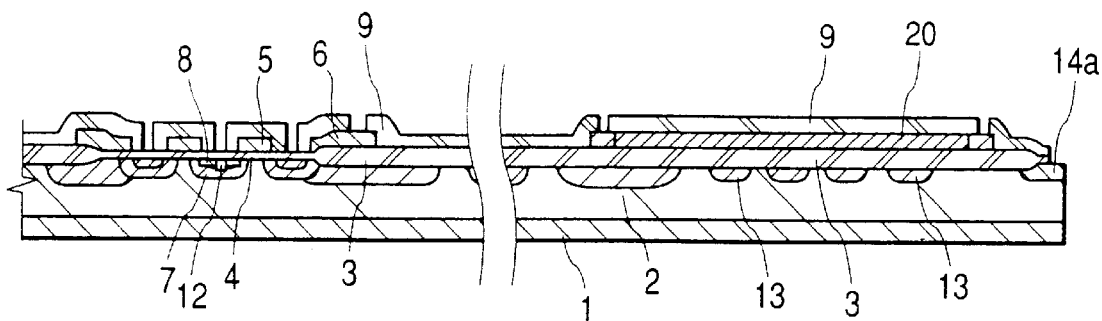
FIG. 15 is a diagram showing the cross section of a model of main elements in a state with an interlayer insulation film and contact holes formed in a process of manufacturing the driving power IC in the first embodiment.

Then, typically a PSG (Phosphorous Silicate Glass) film is deposited on the entire main surface of the semiconductor substrate 1. The interlayer insulation film 9 is created by formation of an SOG (Spin On Glass) film in a coating process. Holes are created by boring through the interlayer insulation film 9, being exposed to an n⁺ layer 8 to serve as a source area, a gate wire 6 and a connection area of the element SR. A state at the end of the process is shown in FIG. 15.

Figure 16:
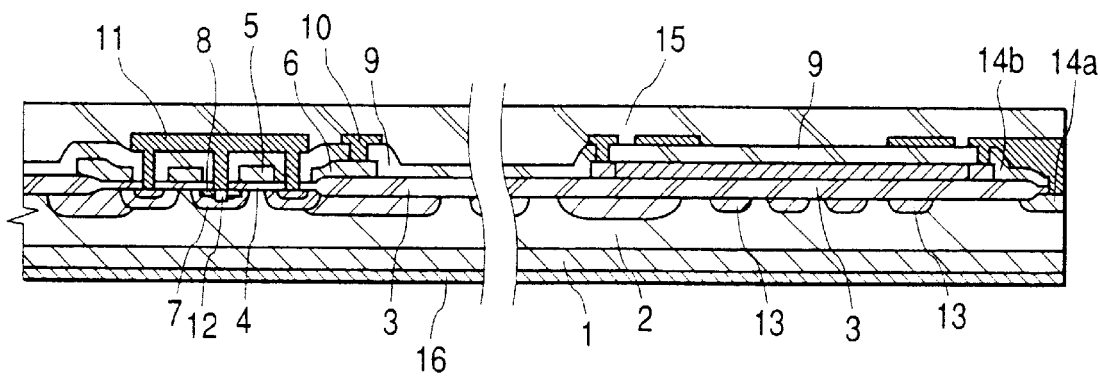
FIG. 16 is a diagram showing the cross section of a model of main elements in a state with a protection insulation film formed in a process of manufacturing the driving power IC in the first embodiment.

Next, a conductor film or a metallic film is created on the semiconductor substrate's entire main surface including the insides of these holes. The conductor film is made of typically aluminum including silicon. Then, this metallic film is subjected to a patterning process to form a gate guard ring 10, a source wire 11 and a guard ring 14. Subsequently, the silicon-oxide film is coated with polyimid stacked on the film as a layer by adoption of a plasma CVD technique using typically tetraethoxyline (TEOS) gas mainly as the source gas, and a protection insulation film 15 is created for covering the entire main surface of the semiconductor substrate 1. On the other hand, the back surface of the n⁺ semiconductor substrate 1 is polished before creation of a drain electrode 16 by sequentially stacking nickel, titan, nickel and silver layers on the back surface through adoption of a deposition technique. A state at the end of this process is shown in FIG. 16.

Hereafter, ordinary processes are carried out to make the driving power IC. The ordinary processes are not explained in this specification.

As described above, in the first embodiment, since the start resistor (or the resistor element) SR can be formed by utilizing the process to create the main switch MS and the starter switch SS during the manufacture, the number of processes does not increase. In addition, since the start resistor SR is not provided in the active area but created on the field insulation film, the size of the driving power IC can be reduced.

In the fabrication of the resistor element in the present invention, it is desirable to manufacture the element so that electric potentials appearing at portions of a hypothetical equivalent segment resistor having the shape of a straight line connecting the start and end edges of the resistor element SR agree with electric potentials appearing at portions on the surface of a semiconductor substrate which correspond to the portions of the segment resistor. For the sake of convenience, however, there is conceived a method to merely make electric potentials at some portions agree with each other and electric potentials at other portions are approximately close to each other. Modified versions implementing such conceived method are explained by referring to FIGS. 17 to 23.

Figure 17:
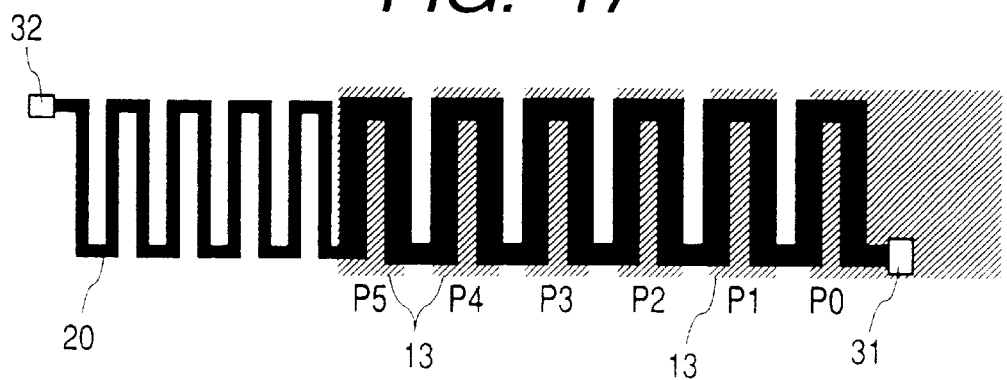
FIG. 17 is a diagram showing of a model representing a first modified version of the resistor layer in the driving power IC in the first embodiment.

FIG. 17 is a diagram showing of a model representing a first modified version of the resistor layer in the driving power IC in the first embodiment. In this version, the zigzag width of the zigzag pattern is fixed throughout the resistor element from the start edge 31 to the end edge 32. However, the zigzag pitch of the resistor layer 20 for area A is made greater than the zigzag pitch of the resistor layer 20 for area B where area A is an area between the start edge 31 and the FLR 13 (P5) the outermost circumference and area B is an area between the end edge 32 and the FLR 13 (P5) on the outermost circumference. In addition, the resistor-layer width or the resistor-line width of the resistor layer 20 for area A is made greater than the resistor-layer width of the resistor layer 20 for area B.

Figure 18:
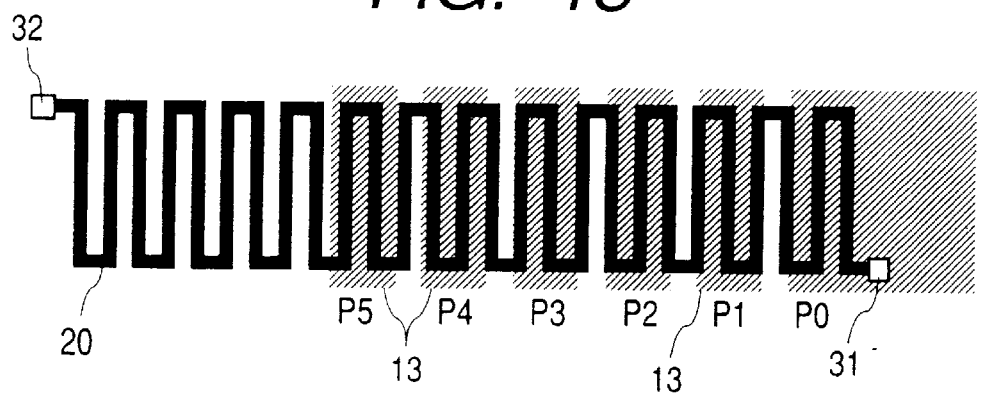
FIG. 18 is a diagram showing of a model representing a second modified version of the resistor layer in the driving power IC in the first embodiment.

FIG. 18 is a diagram showing of a model representing a second modified version of the resistor layer in the driving power IC in the first embodiment. In this version, the zigzag width and the zigzag pitch of the zigzag pattern are fixed throughout the resistor element from the start edge 31 to the end edge 32. However, the sheet resistance on the outer side of the FLR 13 (P5) on the outermost circumference is made different from the sheet resistance on the inner side of the FLR 13 (P5). To be more specific, the sheet resistance of the resistor layer 20 on the inner side is made low while the sheet resistance of the resistor layer 20 on the outer side is made high. Also in the case of this version, the strength to withstand a voltage can be prevented from deteriorating due to a strong electric field.

Figure 19:
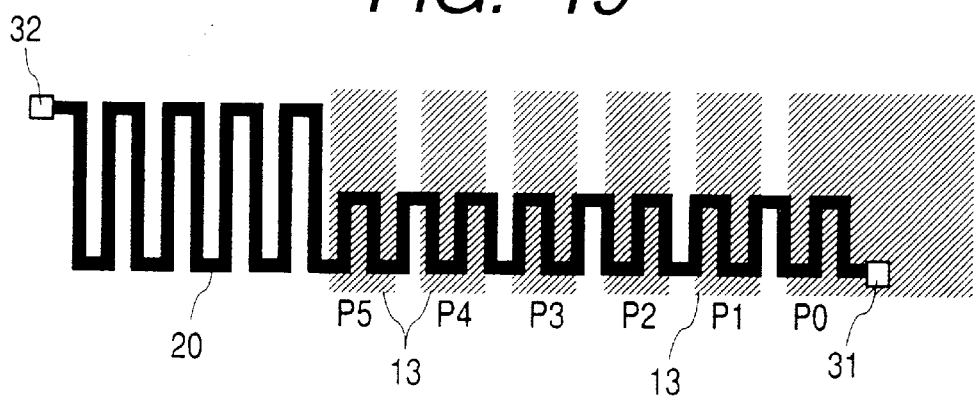
FIG. 19 is a diagram showing of a model representing a third modified version of the resistor layer in the driving power IC in the first embodiment.

FIG. 19 is a diagram showing of a model representing a third modified version of the resistor layer in the driving power IC in the first embodiment. In this version, the zigzag pitch is uniform over the entire resistor element from the start edge 31 to the end edge 32 but the zigzag width on the outer side of the FLR 13 (PS) on the outermost circumference is made different from the zigzag width on the inner side of the FLR 13 (P5). To be more specific, the zigzag width of the resistor layer 20 on the inner side is made small while the zigzag width of the resistor layer 20 on the outer side is made large. Also in the case of this version, the strength to withstand a voltage can be prevented from deteriorating due to a strong electric field.

Figure 20:
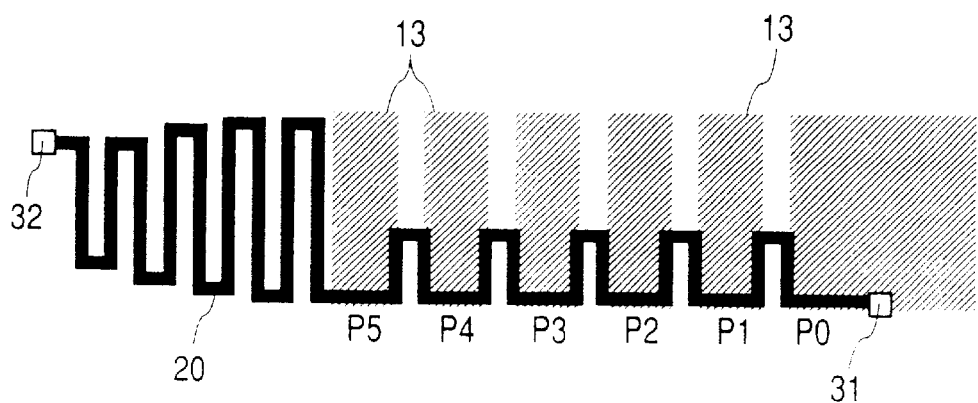
FIG. 20 is a diagram showing of a model representing a fourth modified version of the resistor layer in the driving power IC in the first embodiment.

FIG. 20 is a diagram showing of a model representing a fourth modified version of the resistor layer in the driving power IC in the first embodiment. In this version, the zigzag pitch on the outer side of the FLR 13 (P5) on the outermost circumference is made different from the zigzag pitch on the inner side of the FLR 13 (PS), and the zigzag width on the outer side is becoming smaller gradually so that the electric potentials appear on the surface of the semiconductor substrate 1 between the end edge 32 and the FLR 13 (P5) on the outermost circumference as shown by the curve d in FIG. 1(c). Also in the case of this version, the strength to withstand a voltage can be prevented from deteriorating due to a strong electric field.

Figure 21:
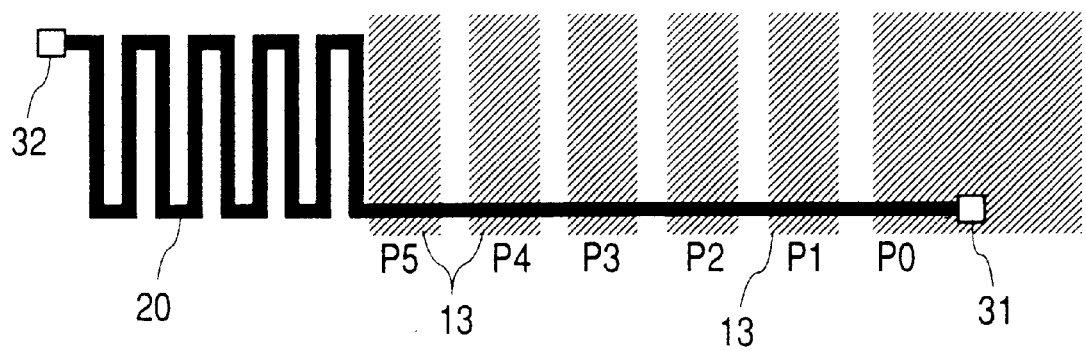
FIG. 21 is a diagram showing of a model representing a fifth modified version of the resistor layer in the driving power IC in the first embodiment.

FIG. 21 is a diagram showing of a model representing a fifth modified version of the resistor layer in the driving power IC in the first embodiment. In this version, a pattern of the resistor element is designed so that, in the area between the start edge 31 and the FLR 13 (PS) on the outermost circumference, the resistor element has a straight-line shape with electric potentials represented by the straight line e having a moderate slope as shown in FIG. 1(c) and, in the area between the end edge 32 and the FLR 13 (P5) on the outermost circumference, the resistor element has a zigzag shape. Also in the case of this version, the strength to withstand a voltage can be prevented from deteriorating due to a strong electric field.

Figure 22:
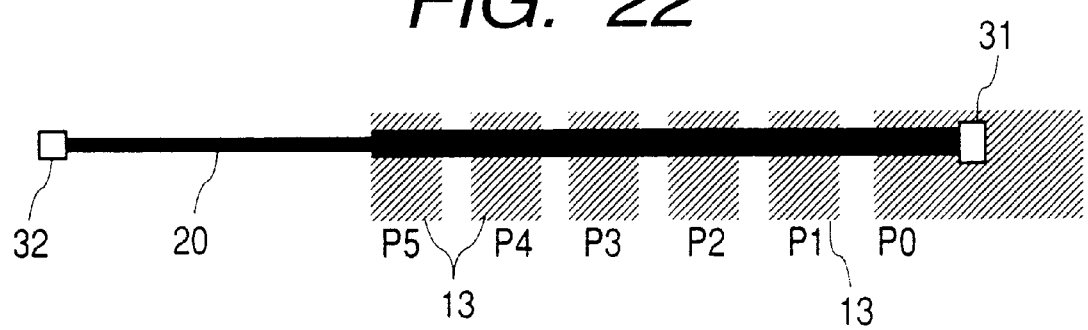
FIG. 22 is a diagram showing of a model representing a sixth modified version of the resistor layer in the driving power IC in the first embodiment.

FIG. 22 is a diagram showing of a model representing a sixth modified version of the resistor layer in the driving power IC in the first embodiment. In this version, a pattern of the resistor element is designed so that, in the area between the start edge 31 and the end edge 32, the resistor element has a straight-line shape. The width of the resistor layer 20 in an area between the start edge 31 and the FLR 13 (P5) on the outermost circumference is made large while the width of the resistor layer 20 in an area between the end edge 32 and the FLR 13 (P5) on the outermost circumference is made small. By properly varying the width in this way, the strength to withstand a voltage can be prevented from deteriorating due to a strong electric field.

Figure 23:
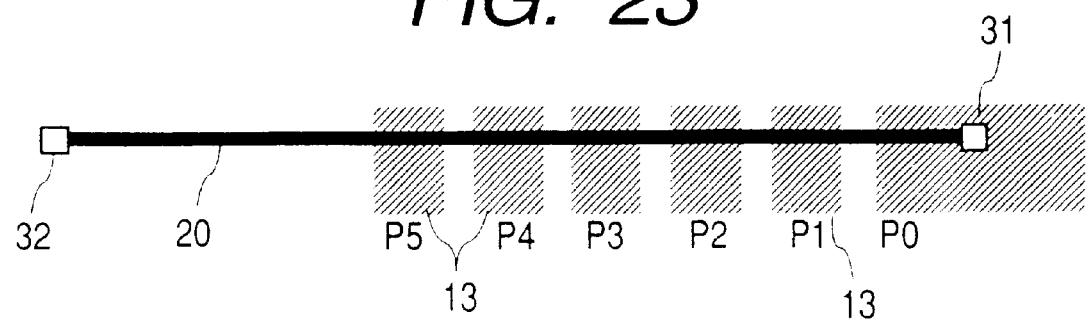
FIG. 23 is a diagram showing of a model representing a seventh modified version of the resistor layer in the driving power IC in the first embodiment.

FIG. 23 is a diagram showing of a model representing a seventh modified version of the resistor layer in the driving power IC in the first embodiment. In this version, a pattern of the resistor element is designed so that, in the area between the start edge 31 and the end edge 32, the resistor element has a straight-line shape with a fixed resistor-layer width. The sheet resistance of the resistor layer 20 in the area between the end edge 31 and the FLR 13 (PS) on the outermost circumference is made small while the sheet resistance of the resistor layer 20 in the area between the end edge 32 and the FLR 13 (P5) on the outermost circumference is made large. By properly varying the sheet resistance in this way, the strength to withstand a voltage can be prevented from deteriorating due to a strong electric field.

In addition, the modified versions described above can also be combined with each other to give a further modification.

In the manufacturing process of the resistor layer 20, the resistor layer 20 is created by:

1: etching in a patterning process after creation of the conductor layer; or
2: selective vapor deposition using a mask.

In addition, the resistor layer 20 can also be created during creation of the gate electrode from poly-silicon in the process of manufacturing the MOSFET.

The sheet resistance can be adjusted by the quantity of the added impurities. The resistor layer 20 can also be made of different materials in its longitudinal direction. For example, a metallic wire and a poly-silicon layer can be used at some locations in the longitudinal direction of the resistor layer 20.

In addition, the thickness of the field insulation film can be increased to a value in the range 3 to 5 $\mu$m over the conventional thickness of about 1.5 $\mu$m in order to make electric potentials appearing at portions of a hypothetical equivalent segment resistor having the shape of a straight line connecting the start and end edges of the resistor element SR agree with electric potentials appearing at portions on the surface of a semiconductor substrate which correspond to the portions of the segment resistor.

The first embodiment exhibits the following effects:

1: Electric potentials appearing at portions of a hypothetical equivalent segment resistor having the shape of a straight line connecting the start edge 31 and the end edge 32 of the resistor element (start resistor) SR agree with electric potentials appearing at portions on the surface of a semiconductor substrate which correspond to the portions of the segment resistor, or the latter potentials are approximately close to the former potentials. Thus, hole-electron pairs generated in bulk are not attracted by an electric field to a specific location even if a high voltage is applied to the resistor element. As a result, generated pairs of holes and electrons of the pairs recombine, neutralizing each other. Therefore, no channel is developed between the field limiting rings so that the withstand voltage is stabilized, preventing the strength to withstand a voltage from deteriorating.
2: Since the sheet resistance of the resistor layer serving as the start resistor is set at a low value of 10 k$\Omega$/□, the amount of dissipated heat can be made constant. In addition, by forming the resistor layer into a zigzag shape, it is possible to increase the length of the resistor layer. With the length increased, the area dissipating heat is widened so that the heat dissipation efficiency is also raised. As a result, it is possible to avoid a destruction incident caused by fusion of the poly-silicon layer serving as the resistor layer due to dissipated heat.
3: Effects 1 and 2 described above result in a highly reliable semiconductor device, that is, allow a driving power IC for a switching regulator to be provided.
4: Since the start resistor is created on a field insulation film in a periphery area instead of being created on an active area, the size of the semiconductor chip can be made small and the cost to manufacture the semiconductor device can be reduced in comparison with a structure in which the start resistor is created in an active area.

Second Embodiment

Figure 24:
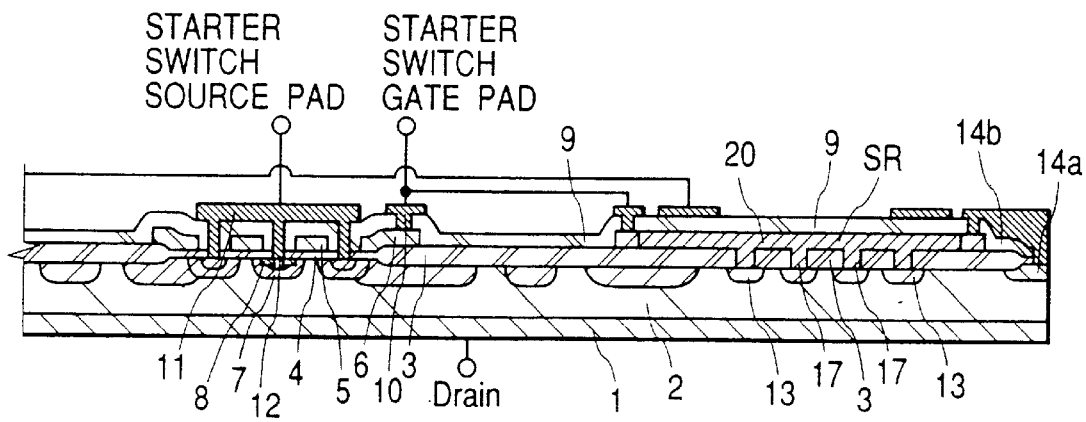
FIG. 24 is a diagram showing a model of a starter switch and a start resistor portion, which are in a second embodiment of the present invention.
Figure 25:
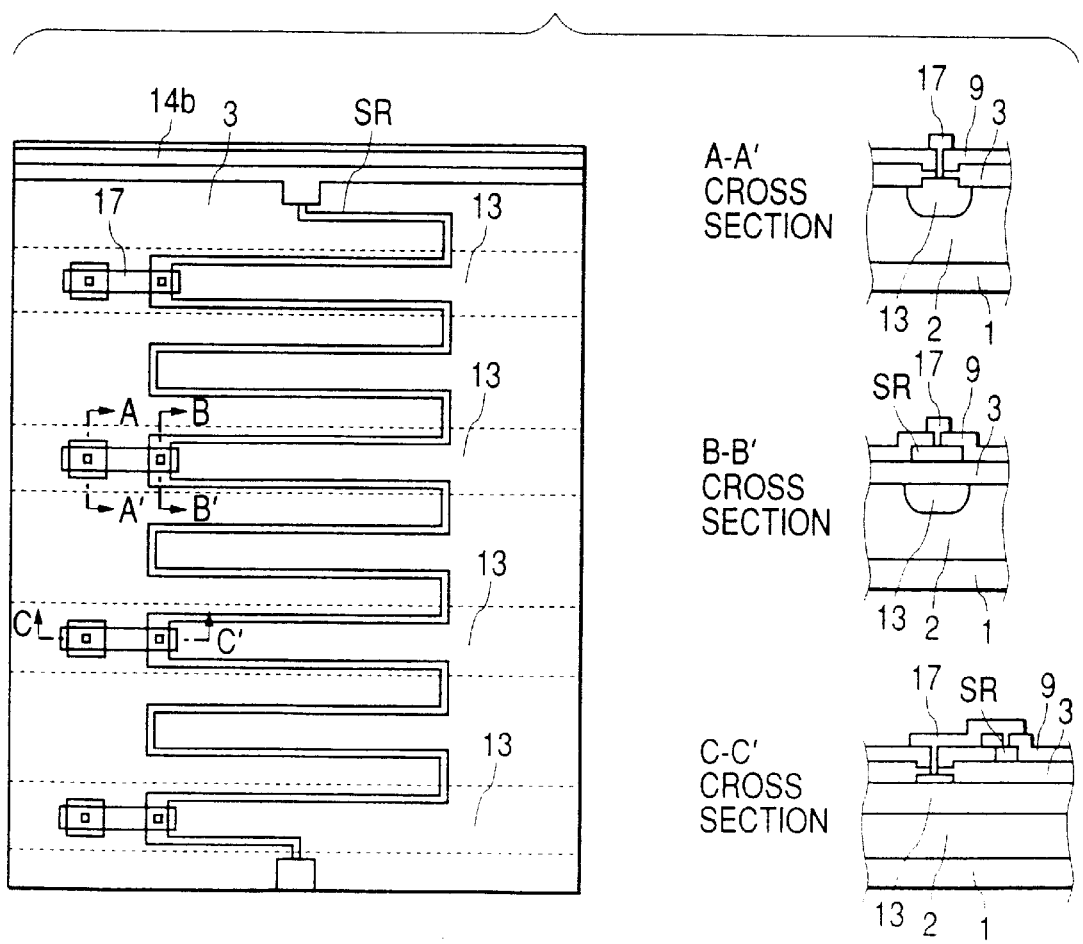
FIG. 25 is a diagram showing the top view of a model representing the resistor element in the second embodiment of the present invention and cross sections of portions of the resistor element.

FIGS. 24 and 25 are each a diagram relevant to another embodiment of the present invention, namely, the second embodiment. FIG. 24 is a diagram showing a model of a starter switch and a start resistor portion, which are provided by a second embodiment of the present invention. FIG. 25 is a diagram showing the top view of a model representing the resistor element in the second embodiment of the present invention and cross sections of portions of the resistor element.

In the case of the second embodiment, the driving power IC has a configuration in which the FLRs 13 are electrically connected to the resistor layer 20 as shown in FIG. 24. FIG. 24 is a conceptual diagram which shows that direct contact holes are formed through the field insulation film 3 at locations beneath the resistor layer 20 and portions of the field insulation film 3 are embedded in the contact holes, being electrically connected to the FLRs 13. Since the field insulation film 3 is thick, however, fine fabrication is difficult. Thus, in actuality, the contact holes are formed on portions where thin films exist at locations where the interlayer insulation film 9 and the FLRs 13 extend as shown in FIG. 25. A wire 17 is provided in an area between contact holes and an area including the contact holes. The wire 17 is used for electrically connecting a FLR 13 and a portion of the start resistor corresponding to the FLR 13.

As described above, FIG. 25 is a diagram showing the top view of a model representing the resistor element used as the start resistor SR. Cross sections indicated by reference notations A-A', B-B' and C-C' on the left side are shown on the right side of FIG. 25.

In accordance with the second embodiment, each of FLRs 13 is electrically connected to a corresponding portion of the resistor layer 20 so as to provide equal electric potentials to the FLR 13 and the portion. Thus, much like the first embodiment, electric potentials appearing at portions of a hypothetical equivalent segment resistor having the shape of a straight line connecting the start edge 31 and the end edge 32 of the resistor element (start resistor) SR agree with electric potentials appearing at portions on the surface of a semiconductor substrate which correspond to the portions of the segment resistor, or the latter potentials are approximately close to the former potentials. As a result, the strength to withstand a voltage can be prevented from deteriorating.

The present invention invented by the inventor has been exemplified by embodiments as described above. It should be noted, however, that the scope of the present invention is not limited to the embodiments. It is needless to say that a variety of changes and modifications can be made to the embodiments without departing from the essentials of the present invention.

Effects exhibited by representatives of the present invention disclosed in this specification are explained briefly as follows.

1: Electric potentials appearing at portions of a hypothetical equivalent segment resistor having the shape of a straight line connecting the start edge 31 and the end edge 32 of the resistor element (start resistor) SR agree with electric potentials appearing at portions on the surface of a semiconductor substrate which correspond to the portions of the segment resistor, or the latter potentials are approximately close to the former potentials. Therefore, it is possible to prevent the strength to withstand a voltage from deteriorating even if a high voltage is applied to the resistor element serving as the start resistor.

2: Since the sheet resistance of the resistor layer serving as the start resistor is set at a low value of 10 kΩ/□, the amount of dissipated heat can be made almost constant. In addition, by forming the resistor layer into a zigzag shape, it is possible to increase the length of the resistor layer. With the length increased, the area dissipating heat is widened so that the heat dissipation efficiency is also raised. As a result, it is possible to avoid a destruction incident caused by fusion of the poly-silicon layer serving as the resistor layer due to dissipated heat.

3: Effects 1 and 2 described above result in a highly reliable semiconductor device, that is, allow a driving power IC for a switching regulator to be provided.

4: Since the start resistor is created on a field insulation film in a periphery area instead of being created on an active area, the size of the semiconductor chip can be made small and the cost to manufacture the semiconductor device can be reduced in comparison with a structure in which the start resistor is created in an active area.

What is claimed is:

1. A semiconductor device comprising:
   a semiconductor substrate of a first conduction type;
   a transistor created in an active area enclosed by a periphery area on said semiconductor substrate;
   a plurality of field limiting rings which are provided on a main surface of said semiconductor substrate in said periphery area, enclose said active area in a multiplexed state and are each made of a semiconductor layer of a second conductor type opposite to said first conduction type;
   a field insulating film covering the peripheral area of the main surface of said semiconductor substrate;
   a resistor element which is created on said field insulation film, being extended in a direction from an inner side of said field limiting rings to an outer side of said field limiting rings and whose start edge is connected to an electrode having a low electric potential of said transistor and an end edge is connected to an electrode having a high electric potential of said transistor, said end edge being positioned on said outer side of said group of said field limiting rings;
   an interlayer insulation film covering said resistor element; and
   a field plate created on said interlayer film at a location corresponding to said field limiting ring on the outermost circumference and electrically connected to said field limiting ring on said outermost circumference,
   wherein the value of resistance per unit length of said resistor element along a virtual line connecting a start edge and an end edge of said resistor element varies from position to position.

2. A semiconductor device according to claim 1, wherein electric potentials appearing at portions along said virtual line are approximately close to electric potentials appearing at parts of said surface of said semiconductor substrate, which correspond to said portions of said virtual line.

3. A semiconductor device according to claim 1, wherein a resistance value of the resistor element per unit length along said virtual line on an inner side of one of said field limiting rings on the outermost circumference is different from a resistance value per unit length of said virtual line on an outer side of said field limiting ring on said outermost circumference.

4. A semiconductor device according to claim 1, wherein the value of resistance per unit length of said resistor element along said virtual line varies from position to position step by step.

5. A semiconductor device according to claim 1, wherein a zigzag portion is provided between said start and end edges of said resistor element.

6. A semiconductor device according to claim 1, wherein a zigzag portion is provided between said start and end edges of said resistor element and said zigzag portion has a variable zigzag pitch.

7. A semiconductor device according to claim 1, wherein said resistor element has a zigzag portion, and said zigzag portion has a variable zigzag width.

8. A semiconductor device according to claim 1, wherein a zigzag portion and a straight portion along said virtual line are provided between said start and end edges of said resistor element.

9. A semiconductor device according to claim 1, wherein said resistor element has a variable line width.

10. A semiconductor device according to claim 1, wherein said resistor element has a straight-line shape along the virtual line, and a line width at a portion is different from the rest.

11. A semiconductor device according to claim 1, wherein said resistor element is made of a poly-silicon layer doped with impurities as an additive.

12. A semiconductor device according to claim 1, wherein said resistor element is made of a metallic portion and a poly-silicon layer doped with impurities as an additive and electrically connected to said metallic portion.

13. A semiconductor device according to claim 1, wherein said resistor element has a variable sheet-resistance value.

14. A semiconductor device according to claim 1, wherein said resistor element has a sheet-resistance value of not greater than 10 kΩ/□.

15. A semiconductor device according to claim 1, wherein the thickness of said field insulation film beneath said resistor element has a value in the range of 3 to 5 μm.

16. A semiconductor device according to claim 1, wherein said field limiting rings and portions of said respective resistor element superposed on said field limiting rings are electrically connected to each other.

17. A semiconductor device according to claim 1, including:
   a first terminal to which a signal is supplied;
   a second terminal to which a reference electric potential is supplied;
   a control terminal;
   a starter-circuit control terminal for a starter circuit;
   a second starter-circuit terminal to which a reference electric potential of said starter circuit is supplied;
   a main-switch transistor serving as a main switch and comprising: a main-switch first electrode connected to said first terminal; a main-switch second electrode connected to said second terminal; and a main-switch control electrode connected to said control terminal; and a starter-switch transistor serving as a starter switch and comprising: a starter-switch first electrode connected to said first terminal; a starter-switch second electrode connected to said second starter-circuit terminal; and a starter-switch control electrode connected to said starter-circuit control terminal; wherein said resistor element is connected in series between said first terminal and said starter-switch control electrode.

18. A semiconductor device according to claim 1, including:

a first terminal to which a signal is supplied;

a second terminal to which a reference electric potential is supplied;

a control terminal;

a current-sensing terminal;

a starter-circuit control terminal for a starter circuit;

a second starter-circuit terminal to which a reference electric potential of said starter circuit is supplied;

a main-switch transistor serving as a main switch and comprising: a main-switch first electrode connected to said first terminal; a main-switch second electrode connected to said second terminal; a main-switch control electrode connected to said control terminal; and a current-sensing electrode connected to said current-sensing terminal and used for sensing a current output by said main-switch first electrode;

a starter-switch transistor serving as a starter switch and comprising: a starter-switch first electrode connected to said first terminal; a starter-switch second electrode connected to said second starter-circuit terminal; and a starter-switch control electrode connected to said starter-circuit control terminal; wherein said resistor element is connected in series between said first terminal and said starter-switch control electrode.

* * * * *